(12) United States Patent
Ito

(10) Patent No.: US 6,992,942 B2
(45) Date of Patent: Jan. 31, 2006

(54) CELL LEAKAGE MONITORING CIRCUIT AND MONITORING METHOD

(75) Inventor: Yutaka Ito, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 32 days.

(21) Appl. No.: 10/842,468

(22) Filed: May 11, 2004

(65) Prior Publication Data

US 2004/0228183 A1 Nov. 18, 2004

(30) Foreign Application Priority Data

May 16, 2003 (JP) .......................... 20003-139241

(51) Int. Cl.
*G11C 7/00* (2006.01)

(52) U.S. Cl. .................. 365/222; 365/189.07; 365/194

(58) Field of Classification Search ................ 365/222, 365/189.07, 194
See application file for complete search history.

(56) References Cited

U.S. PATENT DOCUMENTS 5,652,729 A * 7/1997 Iwata et al. .................. 365/222
6,141,278 A * 10/2000 Nagase ........................ 365/222

FOREIGN PATENT DOCUMENTS

| JP | 10-289573   | 10/1998 |
| JP | 2002-56671  | 2/2002  |
| JP | 2002-110944 | 4/2002  |
| JP | 2003-77273  | 3/2003  |

* cited by examiner

*Primary Examiner*—Huan Hoang
(74) *Attorney, Agent, or Firm*—Young & Thompson

(57) ABSTRACT

A cell leakage monitor includes a circuit for comparing the node voltage of a pseudo-cell equivalent to a memory cell of a DRAM to a reference value to output a refresh signal OSC when the node voltage of the pseudo cell has decreased to a reference value. As the leakage current, the GIDL (gate insulated drain leakage current) of a p-channel MOSFET is used. The cell leakage monitor also includes a circuit for selectively setting the gate voltage of the MOSFET of the leakage source and a circuit for selecting the capacitance value of the capacitor connected to the node voltage.

27 Claims, 33 Drawing Sheets

| IN [2:0] | OUT [7:0] |
|---|---|
| 000 | 11111110 |
| 001 | 11111100 |
| 010 | 11111000 |
| 011 | 11110000 |
| 100 | 11100000 |
| 101 | 11000000 |
| 110 | 10000000 |
| 111 | 00000000 |

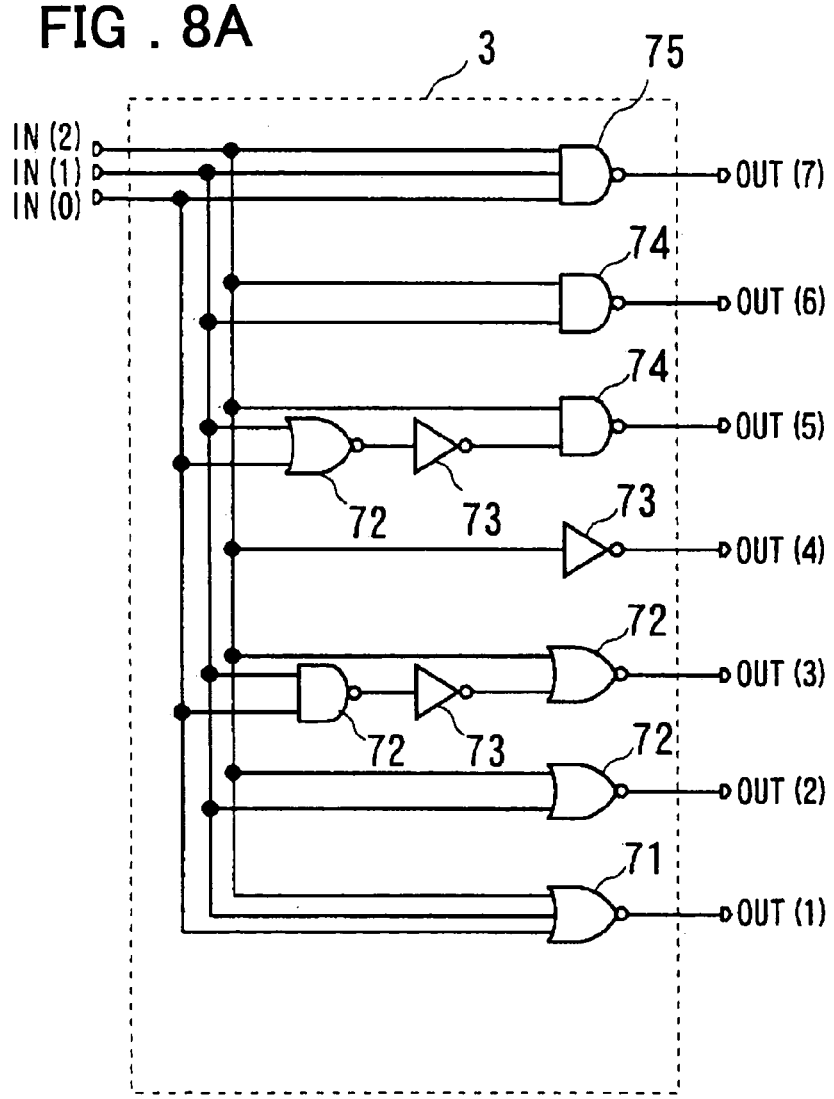

CELL LEAKAGE MONITORING CIRCUIT AND MONITORING METHOD

FIELD OF THE INVENTION

This invention relates to a dynamic semiconductor storage device and, more particularly, to a circuit and a method for monitoring cell leakage.

BACKGROUND OF THE INVENTION

In a dynamic RAM (DRAM), the electric charge in an information storage capacitor in a memory cell leaks little by little, so that a refresh operation becomes necessary to perform. This refresh operation is usually carried out by evaluating the 'real ability' (rate of capacitor leakage) of a large number of memory cells produced and by deciding on a refresh period with sufficient allowance so that the memory cell information will not be lost. However, if the refresh is carried out with a period with sufficient allowance, the number of the refresh cycles becomes larger than is necessary, and the throughput of the system employing the memory is lowered, while the power consumption during data hold time is also increased. Accordingly, there has been developed a memory device in which a number of memory cells equivalent to the memory cells of a memory cell array of a semiconductor memory device (termed 'pseudo-cells') are provided in the semiconductor memory device, and in which a cell leakage monitor circuit is provided for sensing the lowering of the charge, stored in the pseudo-cell by the leakage current of the leakage source, as the voltage lowering, and the refresh operation is carried out at a cycle optimum for the memory cells. As the cell leakage monitor circuit, there is known such a circuit employing a junction leakage for the leakage source (see for example the Patent Publication 1).

The configuration of the cell leakage monitor circuit, disclosed in the Patent Publication 1, is such one as shown in FIG. 32 hereof. The cell leakage monitor circuit, shown in FIG. 32, includes a pseudo cell leakage source 301 which has plurality of PN junction devices 300, a voltage comparator 303 made up by a differential amplifier which receives the voltage of a node SN of the pseudo cell leakage source 301 and a reference voltage VREF differentially and compares the two voltages to output the result of comparison, an inverter 307 which receives and inverts an output AOUT of the voltage comparator 303 to output the inverted signal ACTB, a delay circuit 306 made up by even-numbered stages of inverter strings for delaying the signal ACTB output from an inverter 307, a NAND circuit 308 which receives a signal START output from a refresh control circuit, not shown, and a delayed signal of ACTB output from the delay circuit 306, and two stages of inverter strings, connected to an output of the NAND circuit 308. An output of the two stages of the inverter strings is connected, as a signal CLRB (complementary signal of a clear signal CLR) to the gate of a p-channel MOSFET 310, also termed pMOSFET, the source of which is connected to a voltage VCELL. A signal obtained by inverting the signal CLRB by the inverter 307 is output as OSC (also termed a refresh signal). The drain of the pMOSFET 310 is connected to the drain of an n-channel MOSFET 311, also termed nMOSFET, the source of which is connected to a power supply VSS. The signal START supplied to a three-stage inverter strings which outputs an inverted signal as a signal RESET, which is supplied to the gate of the n-channel MOSFET 311. When the signal START is at a low level, the signal RESET is at a high level to turn on the nMOSFET 311 to discharge the node SN to the ground level.

A capacitor for period adjustment 304 (a MOS capacitor of a capacitance so large as not to be affected by a parasitic capacitance 305) is added to a connection node at which drains of the pMOSFET 310 and the nMOSFET 311 are coupled and which is connected to the node SN.

To the node SN, which is a storage node of the capacitor C305 of the leakage source 301, are connected a plural number of PN junction devices 300 in parallel. The anode sides (P-sides) of the PN junction devices 300 of the leakage source are at a substrate potential VBB of the memory cell array, while the cathode sides (N sides) thereof are connected in common to the storage node SN of the capacitor C305.

FIG. 33 shows a signal waveform diagram showing a typical operation of FIG. 32. When the signal START is at a low level, the signal RESET is at a high level. The voltage of the node SN of the leakage source 301 is reset to the ground potential. Since the voltage of the node SN is lower than the reference voltage VREF, the output AOUT of the voltage comparator 303 is at a low level. An output ACTB (a high level) of the inverter 307 inverting the low level signal AOUT, is delayed by the delay circuit 306. The output signal of the NAND circuit 308 is at a low level, responsive to a high level of the signal ATART and the output of the delay circuit 306. A low level is transferred to the gate of the pMOSFET 310 (the signal OSC goes high) so that the capacitor C305 is charged to the voltage VCELL through the pMOSFET 310 which is in an on-state.

The result is that the output AOUT of the voltage comparator 303 goes high, an output of the NAND circuit 308 receiving a delayed signal of the signal ACTB which is an inverted signal of the signal AOUT, goes high, and the signal OSC falls from a high level to a low level. Hence, the pMOSFET 310 is turned off and the storage node SN of the capacitor 305 is in a floating state for holding electric charge. The electric charge is discharged by the leakage current of the PN junction devices 300. Each time the voltage at the node SN falls down to the reference voltage VREF, with the charge stored in the capacitor 305 decreasing by the leakage current, the pulse signal OSC is output to operate as a refresh timer.

In the Patent Publication 1, there is disclosed the monitor circuit, in which the junction leakage source is formed in a memory size and 10 or more bits are connected in parallel. The period adjustment is by e.g. the voltage VCELL, reference voltage VREF, the number of cells connected, the parasitic capacitor and the like.

There is also known a configuration exploiting the MOS resistance leakage (see e.g. Patent Publication 2). This configuration allows for a large leakage current, so that a large area is not needed.

As for a pause refresh characteristic, which will be described subsequently, reference may be made to e.g. the following Patent Publications 2 and 3. As for a power supply off mode, which also will be described subsequently, reference may be made to e.g. the following Patent Publication 4.

[Patent Publication 1]
 JP Patent Kokai Publication JP-P2002-56671A (page 14, FIG. 32)

[Patent Publication 2]
 JP Patent Kokai Publication JP-A-10-289573 (page 8, FIG. 1)

[Patent Publication 3]

JP Patent Kokai Publication JP-P2002-110944A (page 9, FIG. 10)

[Patent Publication 4]

JP Patent Kokai Publication JP-P2003-77273A (FIGS. 1 and 2)

SUMMARY OF THE DISCLOSURE

Meanwhile, since the PN junction leakage (SGI (substrate separation region) end mode) is generally minute, a large area is needed as a leakage source for monitoring the cell leakage.

Moreover, the PN junction leakage is low in an amount of change dependent on bias-related temperature dependency to render temperature adjustment difficult.

Since the probability of the occurrence of tail bits in the DRAM is not larger than 0.01%, it is similarly difficult to effect matching to pause refresh characteristics.

Additionally, the leakage in the PN junction is low in temperature dependency, such that it is difficult to achieve effective temperature compensation.

Furthermore, the leakage current depends on minute change in the gate voltage and hence it is difficult to adjust the leakage current.

Accordingly, it is an object of the present invention to provide a cell leakage monitor circuit and a cell leakage monitor method whereby temperature compensation and period adjustment may be facilitated.

The present inventors have conducted eager researches to solve the above problems and directed attention to the fact that the high electric field in the PN junction as well as the MOS junction leakage gate end mode (virtually GIDL: gate induced drain leakage) has become marked with the advance of the process miniaturization of a semiconductor device. The present invention has been completed based on the information that the pMOS junction leakage current is changed in orders of magnitudes of digits with the gate voltage.

The above and other objects are attained by a cell leakage monitor circuit in accordance with one aspect of the present invention which preferably comprises a circuit monitoring the amount of electric charge stored in pseudo-cell equivalent to a dynamic memory cell and for outputting a refresh signal when it is found by the circuit that the amount of charge stored in the pseudo-cell has decreased to a preset level by the leakage current of a leakage source. The leakage source is made up by a junction leakage gate end mode of a MOSFET (GIDL (gate induced drain leakage current)).

The cell leakage monitor circuit further comprises a circuit for variably setting the gate voltage of the MOSFET.

A method of monitoring cell leakage, in accordance with another aspect of the present invention comprises the steps of:

monitoring the quantity of charge stored at a charge storage node of a pseudo-cell equivalent to a dynamic memory cell and outputting a refresh signal when it is detected that said quantity of charge of said pseudo-cell has decreased to a preset level by leakage current of a leakage source;

employing as said leakage current, the GIDL (gate induced drain leakage current) of a p-channel MOSFET; and variably setting the gate voltage of said MOSFET and/or capacitance value attached to a charge storage node of said pseudo-cell.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 8A and 8B show an illustrative configuration of a 7-output decoder circuit of FIG. 1.

PREFERRED EMBODIMENTS OF THE INVENTION

The present invention is now explained with reference to preferred embodiments thereof. First, the principle of the present invention is explained, and preferred embodiments thereof are then explained. In the present invention, the junction leakage gate end mode (akin to GIDL (gate induced drain leakage)), constitutes the pseudo-cell leakage source.

In an embodiment of the present invention, there are provided a capacitor selection circuit for adjusting the frequency (period) and a leakage source voltage generating circuit (voltage boost-up circuit) for adjusting the temperature dependency.

By controlling the gate voltage of the pMOSFET, it is possible not only to adjust the frequency (period) but also to control the temperature dependency.

In the present embodiment, the oscillator circuit of the self leakage monitor circuit activates and halts the refresh signal by a signal START from the refresh control circuit.

In the present embodiment, selection of the capacitance for adjusting the frequency (period) and the gate voltage for adjusting the temperature dependency is done at an initial sequence.

In the present embodiment, the selection circuit is made up by a counter and a decoder to permit the selecting operations by a test mode or a laser fuse.

In the present embodiment, in a power supply off mode, in which the internal power supply is halted during memory operation stop time during self-refresh, with the data holding current being reduced, the power up of the internal power supply is confirmed and subsequently the oscillation operation (refresh operation) is continued, by way of performing safety control.

In the present embodiment, the temperature dependency is adjustable as the refresh period (leakage current) is adjusted in orders of magnitudes of digits. Hence, a cell leakage monitor adapted to the real device may be achieved. Moreover, an ideal self-refresh timer, enabling continuous temperature compensation against ambient temperatures, is achieved.

Figure 1:
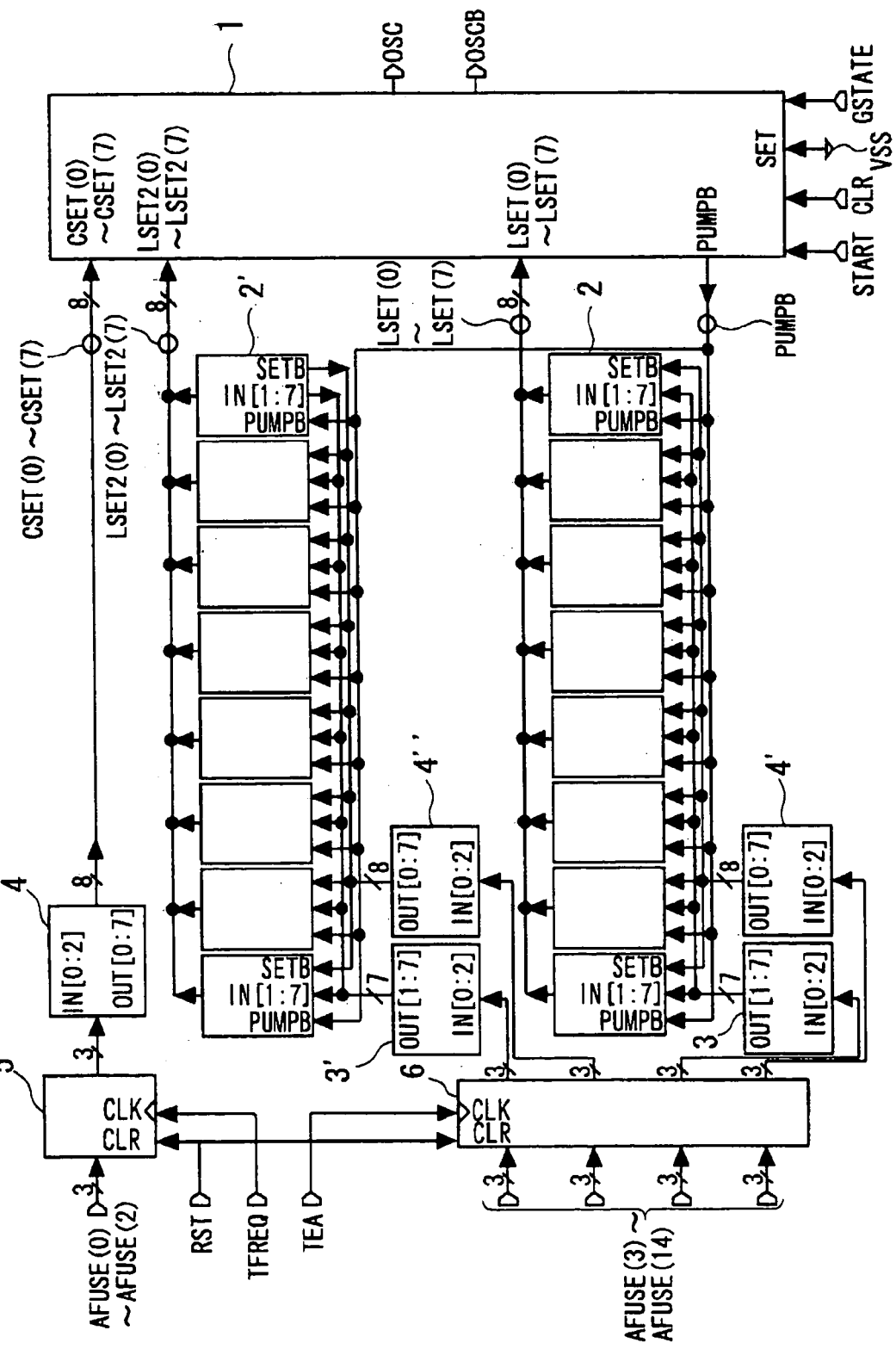
FIG. 1 shows the overall circuit configuration of a cell leakage monitor embodying the present invention.

Referring to the drawings, preferred embodiments of the present invention are described in detail. FIG. 1 shows a configuration of an embodiment of the present invention. Referring to FIG. 1, there is provided an oscillator circuit including a pMOSFET as a leakage source and which composes a main circuit 1 of a cell leakage monitor. The oscillation frequency of the signal OSC, output from the main circuit 1, depends on the leakage source (GIDL) (gate induced drain leakage) of the pMOSFET.

As shown in FIG. 1, there is provided a selection circuit for selectively setting the gate voltage of the pMOSFET as a leakage source in the main circuit 1 of the cell leakage monitor for providing desirable characteristics of the leakage source (GIDL of pMOSFET). This selection circuit is made up by a counter circuit 6, decoder circuits 3 and 3', decoder circuits 4' and 4", and a leakage source voltage generating circuit (voltage boost-up or raising circuits) 2 and 2'.

There are also provided a counter 5 and a decoder 4 as a capacitor selection circuit for selecting the capacitance value of the capacitor used for adjusting the oscillation period of the leakage source.

The counter 5 is a 3-bit counter which receives 3-bit fuse signals AFUSE (0) to AFUSE (2) and a reset signal RST at a CLR terminal thereof. The counter 5 receives a clock signal supplied to a TEREQ terminal of a DRAM. The fuse signals AFUSE will be explained subsequently.

A 3-bit input 8-output decoder circuit 4 decodes the count value of the 3-bit counter 5 and has output terminals O [1:7] connected to CSET(0) to CSET(7) of the main circuit 1 (oscillator).

A counter 6 is a 12-bit counter which receives 12-bit fuse signals AFUSE(3) to AFUSE(14), as control signals, a reset signal RST at a CLR terminal thereof and a signal supplied to a terminal TEA at a clock terminal CLK thereof. The counter 6 counts the signal supplied to a terminal TEA.

The 3-bit input 7-output decoders 3 receives and decodes 3-bit outputs of the 12-bit counter 6 (bits 3–5 of 0–11 bit outputs). The 3-bit input 7-output decoders 3' receives and decodes 3-bit outputs of the 12-bit counter 6 (bits 9–11 of 0–11 bit outputs)

The 3-bit input 8-output decoders 4 receives and decodes 3-bit outputs of the 12-bit counter 6 (bits 0–2 of 0–11 bit outputs). The 3-bit input 8-output decoders 4' receives and decodes 3-bit outputs of the 12-bit counter 6 (bits 6–8 of 0–11 bit outputs).

Each of eight leakage source voltage generating circuits 2 of a first set comprises input terminals IN [1:7], an input terminal SETB, an input terminal PUMPB and an output terminal and has the input terminals IN [1: 7] of which are connected to 7-bit output terminals O [1:7] of the 3-bit input 7-output decoder 3. Each leakage source voltage generating circuit 2 receives at the terminal SETB a decoding result from the 3-bit input 8-output decoder 4' and a boost control signal PUMPB from the main circuit 1 to output a voltage at an output terminal. The respective output signals LSET (0) to LSET (7) are connected to input terminals LSET(0) to LSET(7) of the main circuit 1.

In similar manner, each of seven leakage source voltage generating circuits 2' of a second set comprises an input terminal IN [1:7 ], an input terminal SETB, an input terminal PUMPB and an output terminal. and has the input terminal IN [0:7] connected to the 7-bit output terminal O [1:7] of the 3-bit input 7-output decoder 3'. Each leakage source voltage generating circuit 2' receives at the terminal SETB a decoding result from the 3-bit input 8-output decoder 4" and receives a boost control signal PUMPB from the main circuit 1 to send out output signals LST2(0) to LST2(7) which are coupled to input terminals LSET2(0) to LSET2(7) of the main circuit 1, respectively.

The main circuit 1 of the cell leakage monitor receives a start signal START, a clock signal CLK, a power supply VSS, a signal GSTATE, signals for capacitance value selection CSET(0) to CSET(7), voltage signals LSET(0) to LSET(7), to be applied to the gate electrode of the pMOSFET of the leakage source of the first system, and with voltage signals LSET2(0) to LSET2(7), to be applied to the gate electrode of the pMOSFET of the leakage source of the second system, to output the boost control signal PUMPB, which is active at a low level, and mutually complementary refresh pulse signals OSC and OSCB, where OSCB is a complementary signal of OSC.

The operation of the circuit of the present embodiment, shown in FIG. 1, will be described in the below. The signal TEREQ, is pulsed a desired number of times by the period adjustment test mode. The 3-bit counter 5, which receives the pulsed signal TEREQ, counts up the count value responsive to the pulse. A 3-bit output of the counter 5 is supplied to the 3-bit decoder 4 and decoded to 8-bit signals. The 8-bit signals CSET(0) to CSET(7) are supplied to the main circuit 1 of the leakage monitor to select the value of the capacitance (capacitance for period adjustment) to be added to the leakage source node SN. That is, the signals CSET (0) to CSET (7) are connected to control terminals of eight switches (104A of FIG. 16), connected across the leakage node (SN) and the eight capacitor elements (104B of FIG. 16) in the main circuit 1, such that, when the signal CSET (n), where n=0 to 7, is at a low level, the associated switch (n) is turned on to add the capacitor element (n) to the leakage source node (SN) to delay voltage change in the leakage source node (SN of FIG. 19). That is, the oscillation frequency of the main circuit 1 is lowered (the oscillation period of the signal OSC is prolonged). When the signal CSET(n), where n=0 to 7, is at a high level, the switch (n) is turned off, such that the capacitor element (n), connected to the switch, is not connected to the leakage node SN. The configuration of the main circuit 1 of the cell leakage monitor will be described later with reference to FIG. 19.

When the capacitance value added to the leakage node SN is determined, fuse ROMs, not shown in FIG. 1, are cut to give signals AFUSE(0) to AFUSE(2) (3 bit signals) for obtaining desired CST (0) to CST (7). Meanwhile, the fuse ROM output signals AFUSE(0) to AFUSE(2) operate as output mask signals of the 3-bit counter 5, such that, when AFUSE(n) (n=0, 1, 2) is at a low level, the n'th bit of the counter 5 is of a fixed value (e.g. at a high level). Thus, after startup of the DRAM by power-on following the fuse breakage, desired values of the signals CSET(0) to CSET(7) are entered to the main circuit 1 to select the capacitance value to be added to the leakage node (SN).

Moreover, in the temperature adjustment mode, the signal TEA is pulsed a desired number of times. The 12-bit counter 6, receiving the signal TEA, counts up the counter value responsive to the pulse of the signal TEA. The resulting 12-bit output is divided into lower 6 bits (bits 0 to 5) and upper 6 bits (bits 6 to 11), which are then supplied to the decoder circuits 3 and 4' of the first system and to the decoder circuits 3' and 4" of the first system.

The 6-bit input of the first system will now be described. The lower 3 bits (0 to 2) of the 12-bit counter 6 is supplied to the 3-bit decoder 4', 8-bit outputs of which, representing the result of the decoding, is supplied as a signal SETB to the eight leakage source voltage generating circuits 2 of the first set to determine whether or not the boosted voltage generated in the leakage source voltage generating circuits 2 of the first set is to be supplied to the main circuit 1. The leakage source voltage generating circuits 2, to the terminals SETB of which the high level signal SETB is supplied, are not selected, such that the boosted voltage generated in the leakage source voltage generating circuits 2 is not supplied to the main circuit 1. That is, the output signals LSET (n) (n=0 to 7) of the leakage source voltage generating circuits 2 are in a low level (ground potential). The gate voltage of the pMOSFET of the leakage source is at a low level (ground potential), at this time, such that the GIDL is not noticeable. The leakage current is the junction leakage current, mainly TAT (Trap Assist Tunneling) current, such that the temperature dependency is increased (see FIG. 24). TAT (Trap Assist Tunneling) designate a mechanism in which the leakage current is increased by the current component flowing as tunneling current which is generated by acceleration by an electric filed in the process of carrier excitation, while the carrier generation mechanism of the reverse-biased leakage current in PN junction is the SRH (Shockley Reed Hole) current.

If conversely the signal SETB is at a low level, the boosted voltage is output at an LSET(n) (n=0 to 7) connected to an output terminal of the leakage source voltage generating circuits 2. This boosted voltage is supplied to the main circuit 1 of the cell leakage monitor to serve as the gate voltage of a leakage source (pMOSFET) 101 of the main circuit 1, so that the GIDL becomes noticeable. In this case, the leakage current becomes the junction leakage current, synthesized from the BBT (band to band tunneling) and TAT, with the temperature dependency becoming small. The higher the gate voltage (Vgs) of the pMOSFET, the more marked is the BBT, with the temperature dependency (activation energy) becoming smaller.

The 6-bit inputs of the second system are now described. The upper 3 bits (bits 9 to 11) of the 12-bit counter 6 are supplied to the 3-bit decoder 3'. The 7-bit output of the 3-bit decoder 3' determines the output voltage of the leakage source voltage generating circuits 2' of the second set.

The 3 bits (bits 6 to 8) next following the upper 3 bits of the 12-bit counter 6 are supplied to the 3-bit decoder 4", a decoded output of which is supplied as the signals SETB to the eight leakage source voltage generating circuits 2' to determine whether or not the boosted voltage generated in the leakage source voltage generating circuits 2 of the second set should be supplied to the main circuit 1.

The leakage source voltage generating circuits 2, to the terminal SETB of which the high level signal SETB is supplied, is not selected, such that the boosted voltage generated in the leakage source voltage generating circuits 2' is not supplied to the main circuit 1. The output signals LSET 2($n$) (n=0 to 7) of the leakage source voltage generating circuit 2' are at a low level. When the signals SETB are at a low level, the boosted voltage is output as the output signal LSET2($n$) (n=0 to 7) of the leakage source voltage generating circuits 2'. This boosted voltage is supplied to the main circuit 1 to serve as the gate voltage of a leakage source (PMOSFET) 101' of the main circuit 1.

When all of the 7-bit input signals (IN(1) to IN(7)) are at a low level, the leakage source voltage generating circuits 2 and 2' are at the highest voltage (2×VDD). When all of the 7-bit input signals (IN(1) to IN(7)) are at a high level, the voltage is not boosted and is set to the lowest voltage (VDD−Vth).

In the leakage source voltage generating circuits 2 and 2' of the first and second sets, seven sorts of the boosted voltages may be set by output signals of the 3-bit decoders 3 and 3' supplied to the input terminals IN [1–7].

If, in the leakage source voltage generating circuits 2 and 2' of the first and second sets, it is determined to which number of the leakage sources (pMOSFETs) the boosted voltage is applied (bits 0 to 2 and bits 6 to 8 of the 12-but output of the 12-bit counter 6) and to which value in volt the voltage should be boosted (bits 3 to 5 and bits 9 to 11 of the 12-bit output of the 12-bit counter 6), the fuse ROMs, not shown, outputting the control signals AFUSE(3) to AFUSE (8) for obtaining these signals, are cut.

If, in the above-described embodiment, the power is supplied to the DRAM after cutting the fuses, to start up the RAM, the desired boosted voltage is applied to the gate electrodes of the desired number of the pMOSFETs (leakage sources).

In the present embodiment, there are provided each two systems of the leakage source voltage generating circuits 2 and 2', leakage source selecting circuits (4' and 4") and leakage sources (101 and 101' of FIG. 19), and hence the characteristic (temperature dependency) of the leakage sources may be one which is obtained by synthesizing temperature dependencies of two systems together.

For example, if the temperature dependency of the leakage source of the first system is set to low and that of the leakage source of the second system is set to high, the leakage in the leakage source exhibiting low temperature dependency becomes distinct in the low temperature range, whilst the leakage in the leakage source exhibiting high temperature dependency becomes distinct in the high temperature range. These characteristics are no other than the actual pause refresh characteristics (see FIG. 21) and hence are valid.

The pause refresh characteristics of the DRAM are a set of temperature characteristics of the individual bits, so that the bits with low temperature dependency become distinct in the high temperature range, while those with high temperature dependency become distinct in the high temperature range.

The configuration and the operation of each elements in the circuit shown in FIG. 1 will be described in the below.

Figure 2:
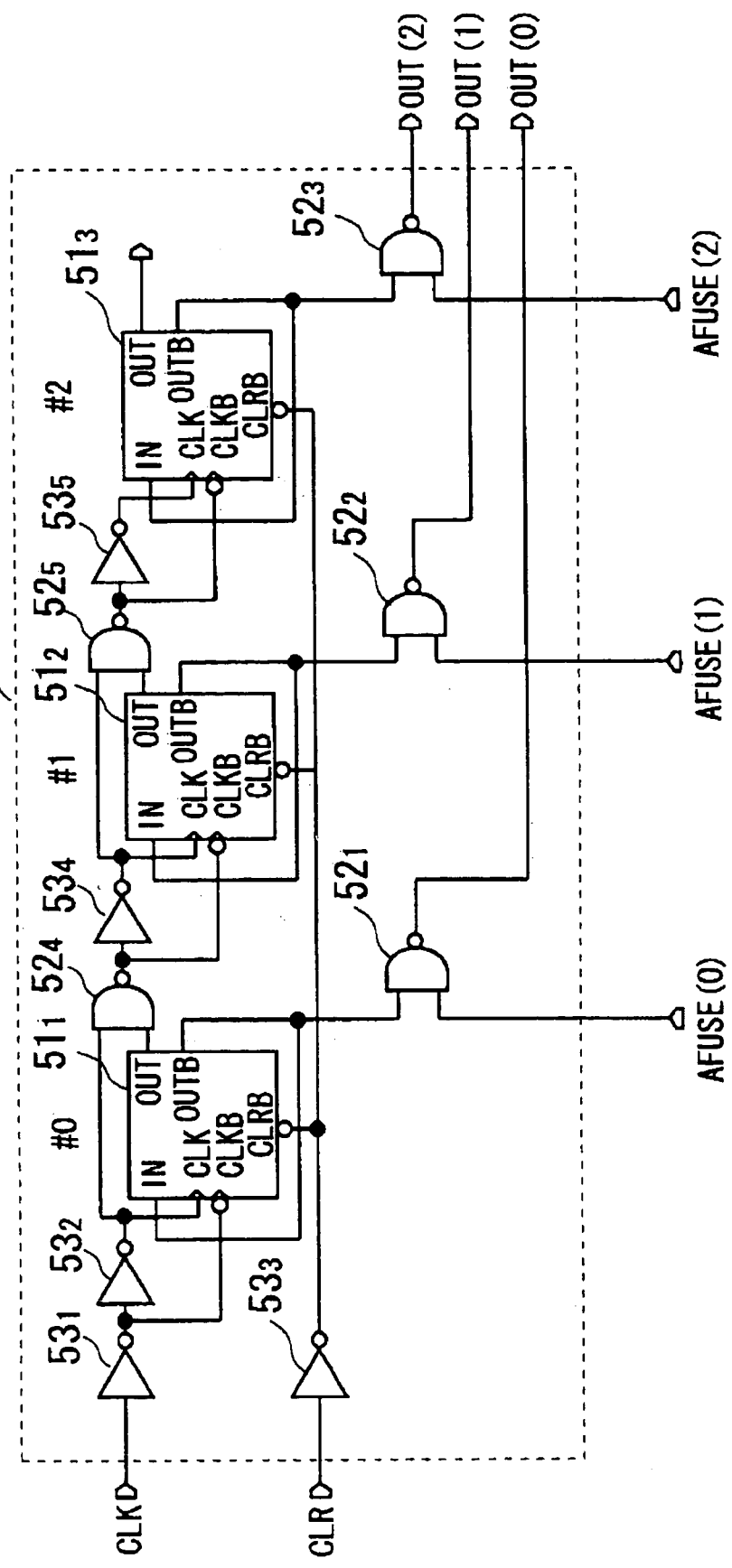
FIG. 2 shows an illustrative configuration of a 3-bit counter circuit of FIG. 1.

FIG. 2 shows the configuration of the 3-bit counter 5. This 3-bit counter comprises a three-stage D-flip-flops $51_1$ to $51_3$, forming a frequency divider, in each of which, of a non-inverting output OUT and an inverting output OUTB, the inverting output OUTB is fed back to a data input terminal IN, and NAND circuits $52_1$ to $52_3$, each of which receives an output signal OUTB of the associated stage of the D type flip-flop $51_1$ to $51_3$ and the associated one of fuse signals AFUSE(0) to AFUSE(2). The outputs of the NAND circuits $52_1$ to $52_3$ are OUT(0) to OUT(2), respectively.

Figure 3:
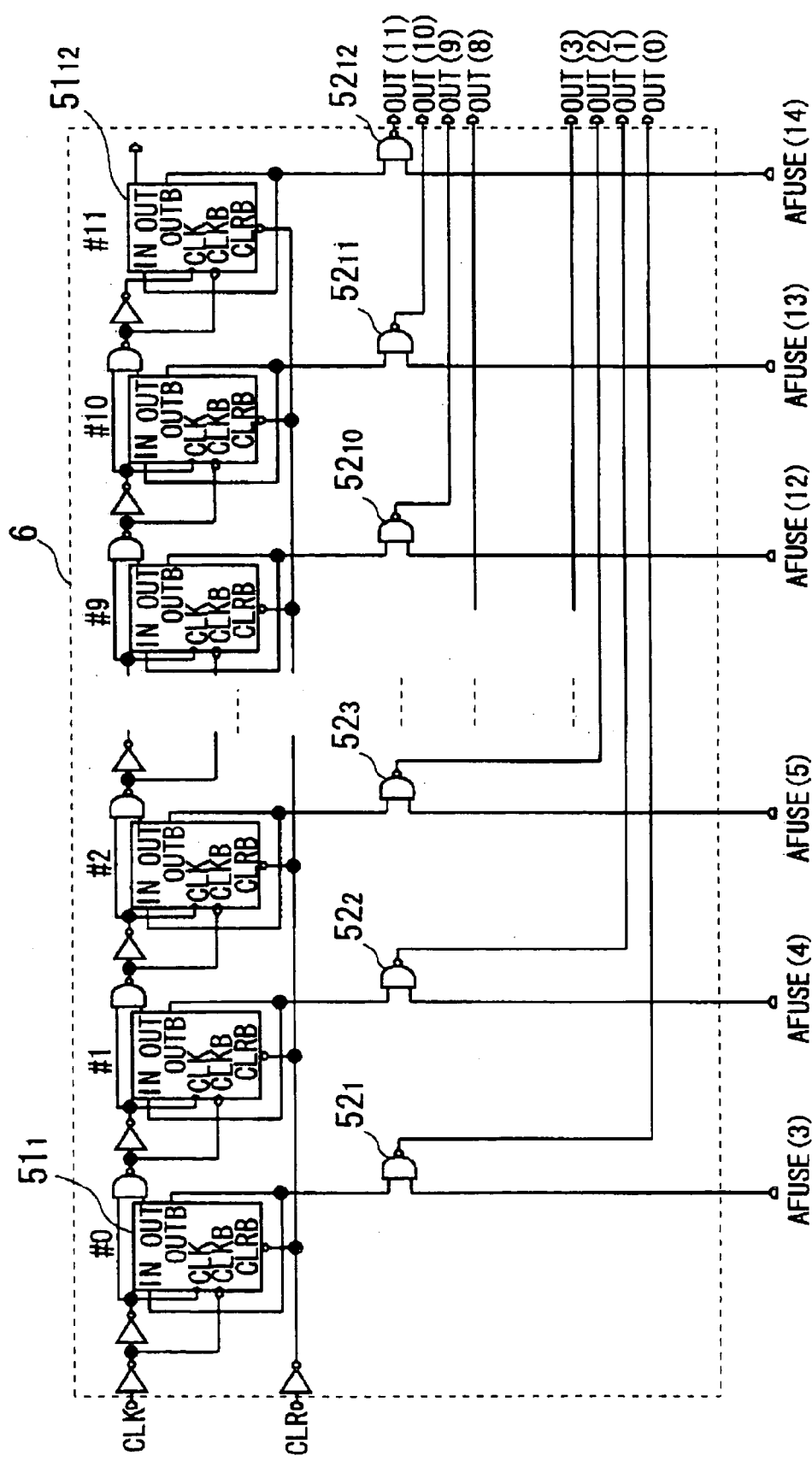
FIG. 3 shows an illustrative configuration of a 12-bit counter circuit of FIG. 1.

FIG. 3 shows the configuration of the 12-bit counter 6. The 12-bit counter 6 is basically of the same structure as the 3-bit counter shown in FIG. 2. Specifically, the 12-bit counter comprises 12 stages of D-flip-flops $51_1$ to $51_{12}$ and NAND circuits $52_1$ to $52_{12}$ which respectively output results of NAND operation of outputs of D-flip-flops $51_1$ to $51_{12}$ and the AFUSE(3) to AFUSE(14) by the NAND to OUT(0) to OUT(12).

Figure 4:
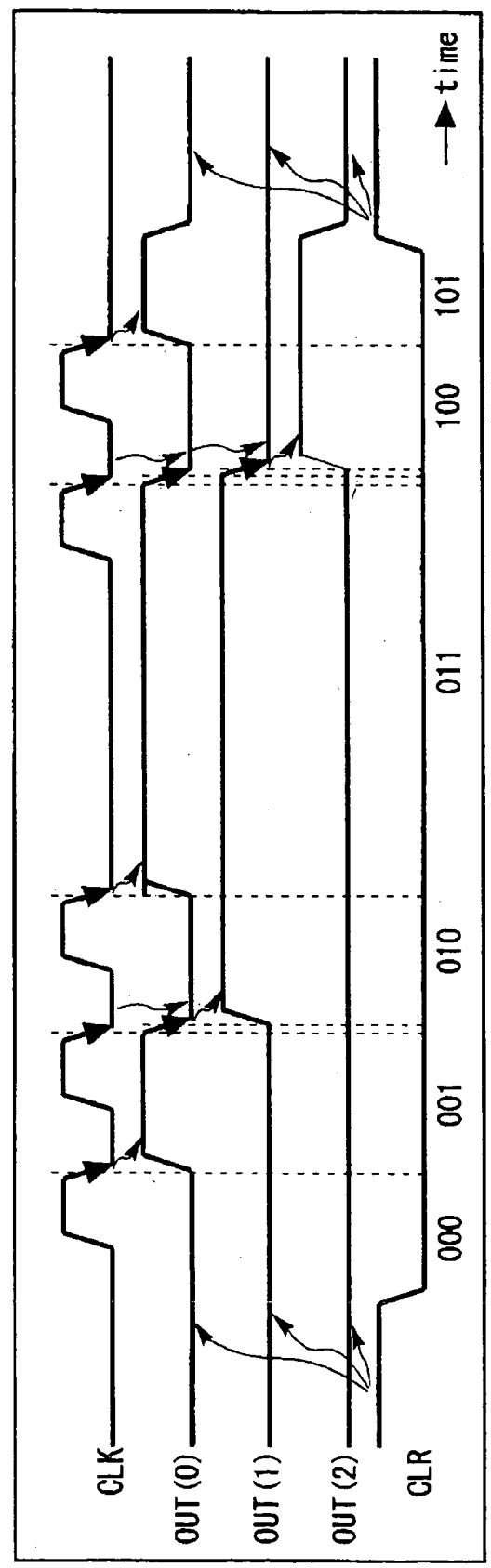
FIG. 4 shows an exemplary operation of a counter circuit.

FIG. 4 shows an exemplary operation of the counter circuit of FIG. 2. Count-up is done by the falling edge of the signal CLK. With the clear CLR at a high level, forced reset occurs, with the counter output then going low.

Figure 5:
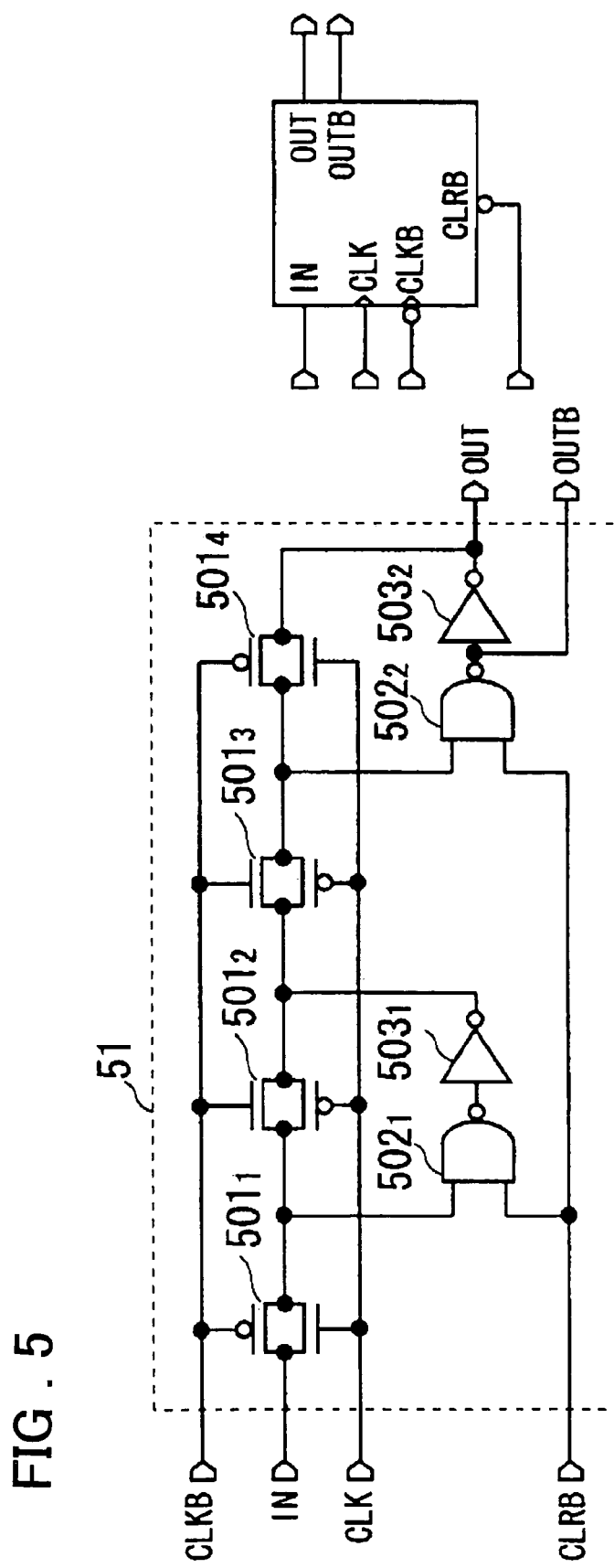
FIG. 5 shows an illustrative configuration of a flip-flop of the counter of FIGS. 2 and 3.
Figure 6:
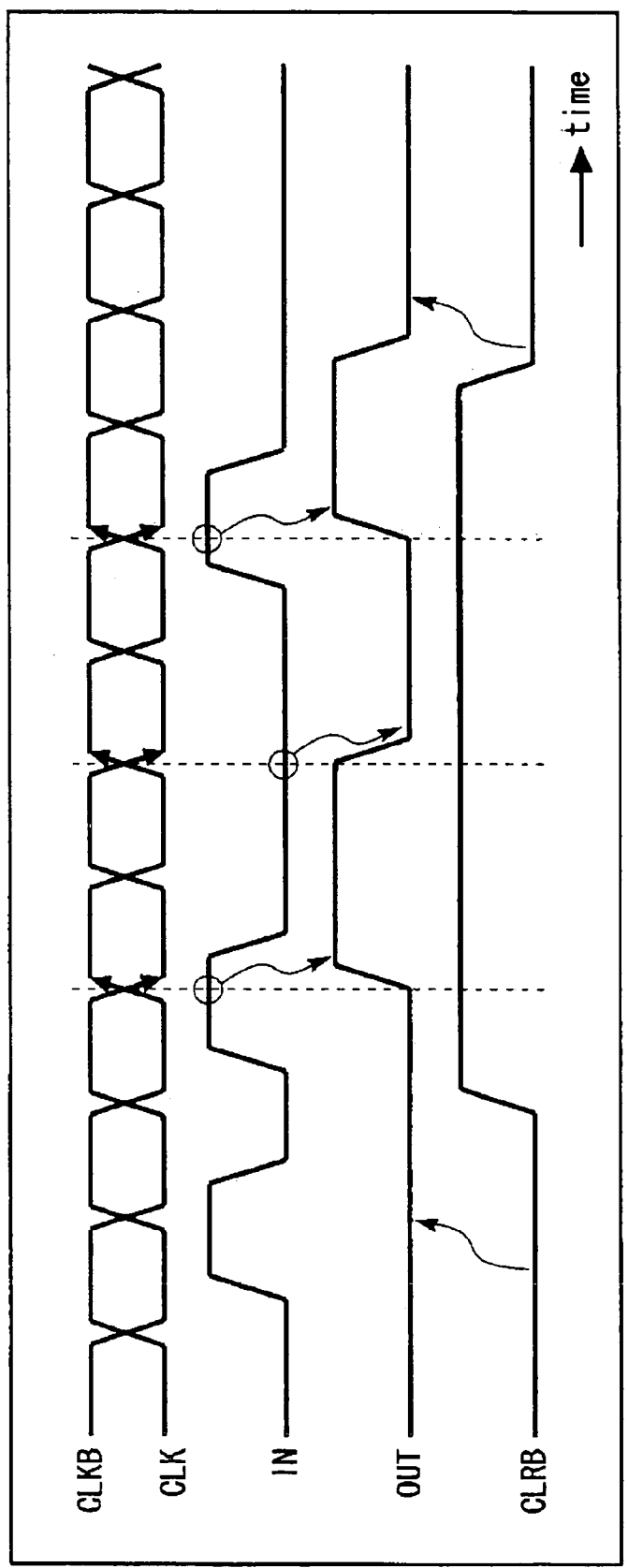
FIG. 6 shows an exemplary operation of the flip-flop of FIG. 5.

FIG. 5 shows an illustrative configuration of the D-flip-flop 51 shown in FIGS. 2 and 3. The flip-flop 51 is an edge trigger flip-flop with a clear terminal. FIG. 6 is a timing chart showing the operation of the flip-flop shown in FIG. 5. In FIG. 6, the NAND circuit 502 operates as an inverter when the clear signal CLR is at a high level. When the clock signals CLK and CLKB, complementary to each other, are at a high level and at a low level, respectively, CMOS transfer gates $501_1$ and $501_4$ are turned on, while CMOS transfer gates $501_2$ and $501_3$ are turned off. The value stored by the slave flip-flop (an output of the inverter $501_3$) is output to an output terminal OUT.

When the clock signals CLK and CLKB, complementary to each other, are at a low level and at a high level, respectively, CMOS transfer gates $501_1$ and $501_4$ are turned off, while CMOS transfer gates $501_2$ and $501_3$ are turned on. The master-flip-flops ($502_1$ and $503_1$) are isolated from the input terminal IN to store and hold the signal value at the input terminal IN directly before the clock VLK goes low. An output of the inverter $503_1$ is entered via CMOS transfer gate $501_3$ to the transfer gates $501_2$, forming the slave flip-flop. An output of the inverter $503_1$ is output at OUT. With the signal CLRB at a low level, the output of the flip-flop 51 is reset.

Figures 7A, 7B:
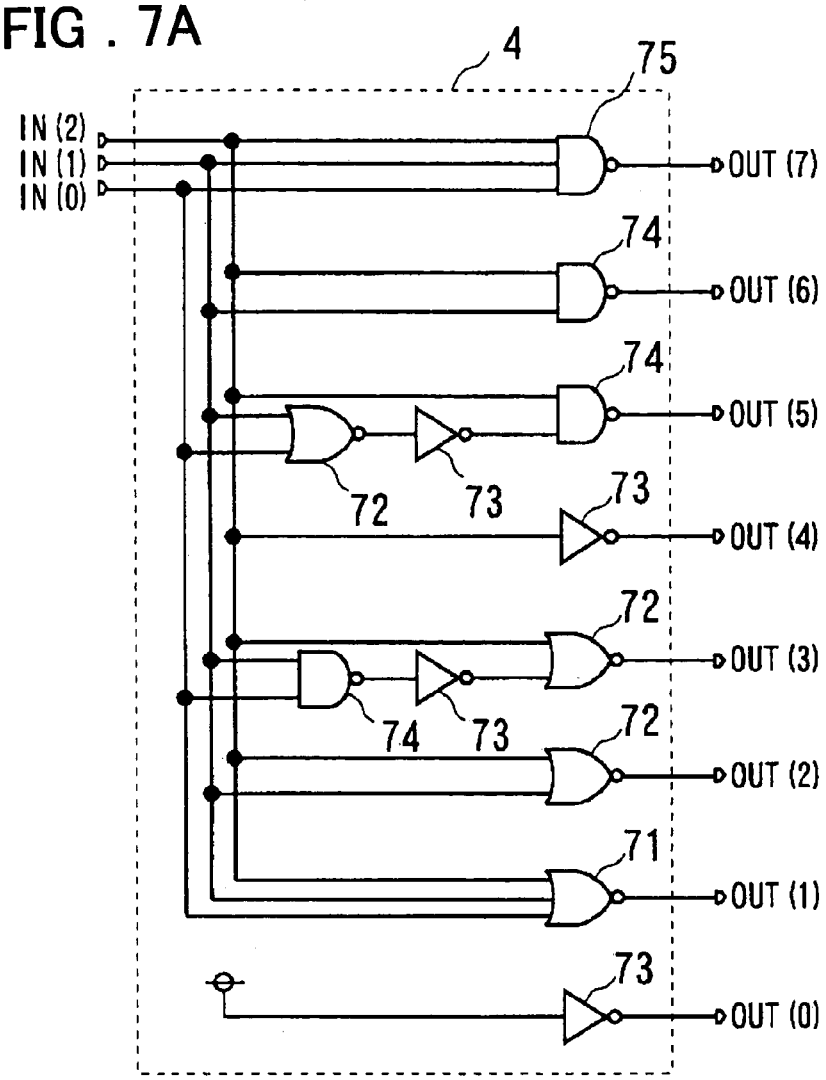
FIGS. 7A and 7B show an illustrative configuration of an 8-output decoder circuit of FIG. 1.

FIG. 7A shows the configuration of the 3-bit input 8-output decoder circuit 4 of FIG. 1, and FIG. 7B shows a truth table of the decoder circuit of FIG. 7A.

FIG. 8A shows the configuration of the 3-bit input 7-output decoder circuit 3 of FIG. 1, and FIG. 8B shows a truth table of the decoder circuit of FIG. 8A.

Figure 9:
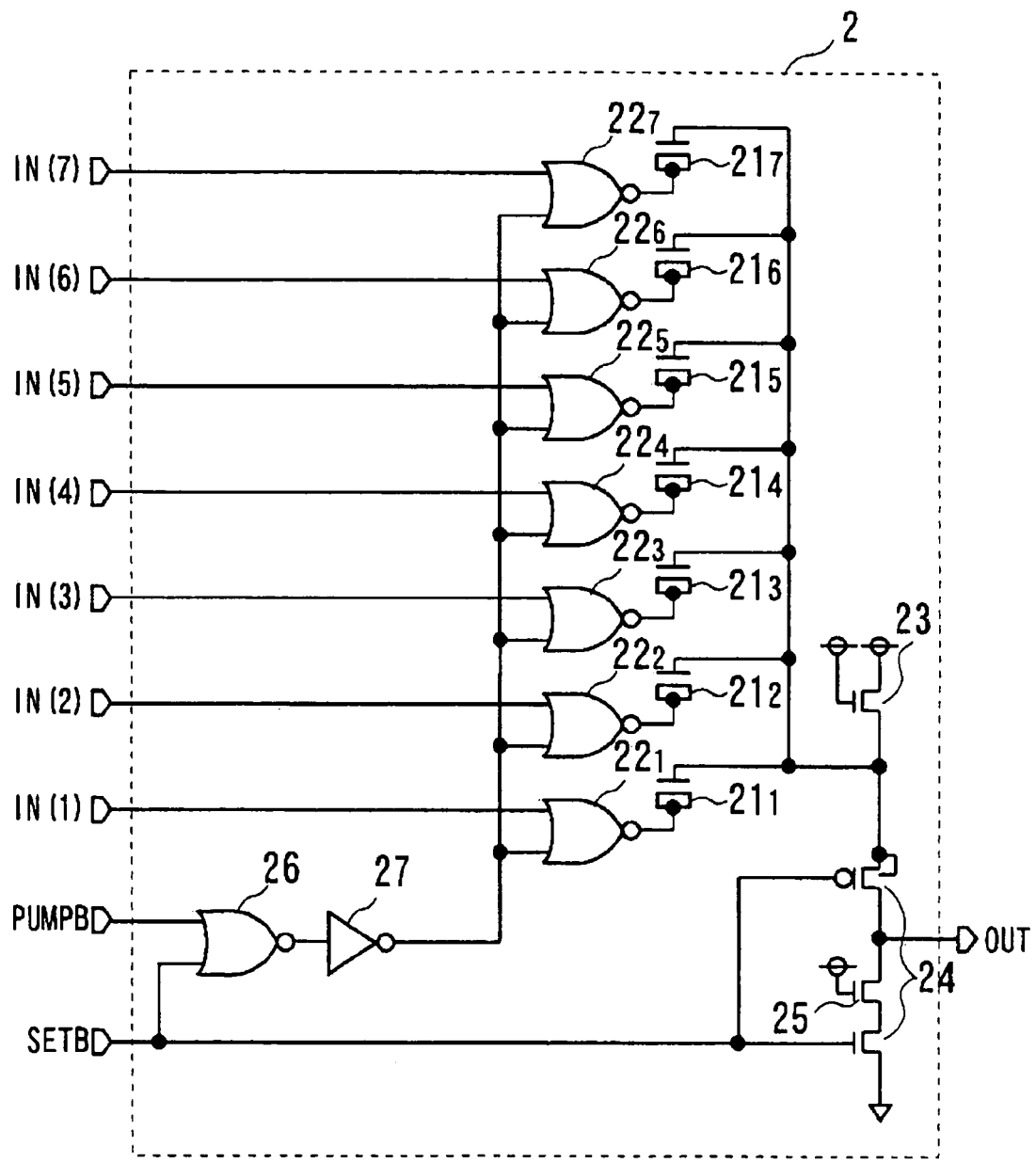
FIG. 9 shows an illustrative configuration of a leakage source gate potential generating circuit of FIG. 1.

FIG. 9 shows the configuration of the leakage source voltage generating circuits (booster circuits) 2 and 2' of FIG. 1. Meanwhile, the leakage source voltage generating circuits (booster circuits) 2 and 2' are of the same structure as each other. Referring to FIG. 9, the leakage source voltage generating circuit 2 includes a NOR circuit 26, supplied with a selection signal SETB and with a boost control signal PUMPB, an inverter 27 for inverting the output of the NOR circuit 26, seven NOR circuits $22_1$ to $22_7$, each supplied with one of the IN(0) to IN(7) and with an output of the inverter 27, boost capacitors (MOS capacitors) $21_1$ to $21_7$, each having a source and a drain connected to the output of the associated NOR circuit and each having a gate connected common, an inverter 24 made up by an nMOSFET and a pMOSFET, the gates of which are supplied with the signal SETB, and an nMOSFET 23, having a drain and a source connected to the power supply VCC and to a source of the pMOSFET of the inverter 24 and having a gate to which is supplied the power supply VCC. The source of the nMOSFET 23 is connected to the common gate of the boost capacitors (MOS capacitors) $21_1$ to $21_7$. The leakage source voltage generating circuit also includes, across the nMOSFET of the inverter 24 and the output terminal OUT, an nMOSFET 25, the gate of which is supplied with the power supply voltage VCC. The nMOSFET 25 operates for moderating the voltage withstand properties of the nMOSFET 24.

With the signal SETB at a high level, an output OUT of the inverter 24 goes low, such that no boost voltage is output. With the signal SETB low and with the boost control signal PUMPB active (low), an output of the NOR circuit 26 is high, with the output of the inverter 27 being low. If, in this case, all of the IN(1) to IN(7) are low, the outputs of the NOR circuits $22_1$ to $22_7$ are high and the boost capacitors (MOS capacitors) $21_1$ to $21_7$ are boosted up and a voltage equal to twice the power supply voltage VCC (VCC-Vth; Vth being a threshold voltage of nMOSFET) is supplied to the output OUT. With all of the IN(1) to IN(7) at a high level, the outputs of the NOR circuits $22_1$ to $22_7$ are low. The boost capacitors (MOS capacitors) $21_1$ to $21_7$ are not boosted up and the power supply voltage VCC (VCC-Vth; Vth being a threshold voltage of nMOSFET) is supplied to the output OUT.

Figure 11:
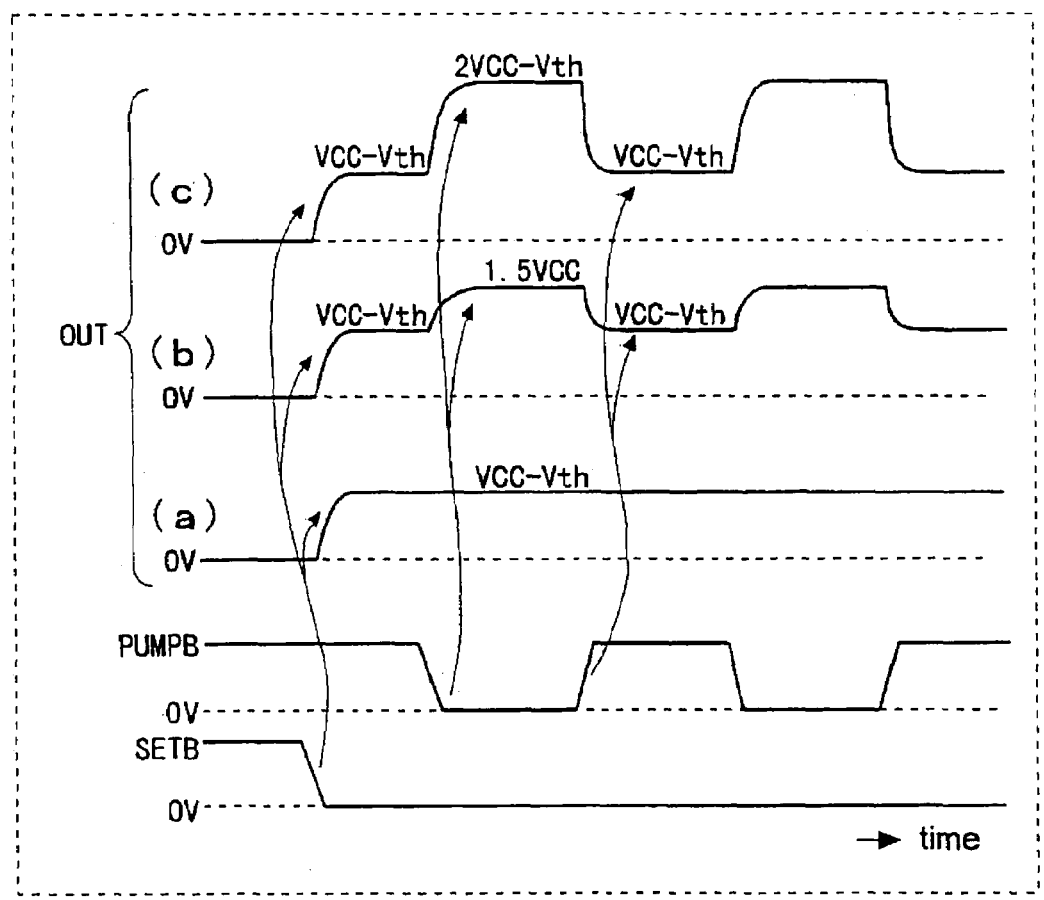
FIG. 11 shows an example of an operational waveform of the circuit of FIG. 9.

FIG. 11 depicts a signal waveform diagram for illustrating the operation of the circuit shown in FIG. 9. With the signal SETB and the signal PUMPB both low, a voltage from 2VCC-Vth to VCC-Vth is output from the output terminal OUT, depending on the value of the IN(0) to IN(7) (see (a) to (c) of OUT). With the signal PUMPB high, the voltage of VCC-Vth is output from the output terminal OUT. With the signal SETB high, a low level (ground potential) is output at the output OUT.

Figure 10:
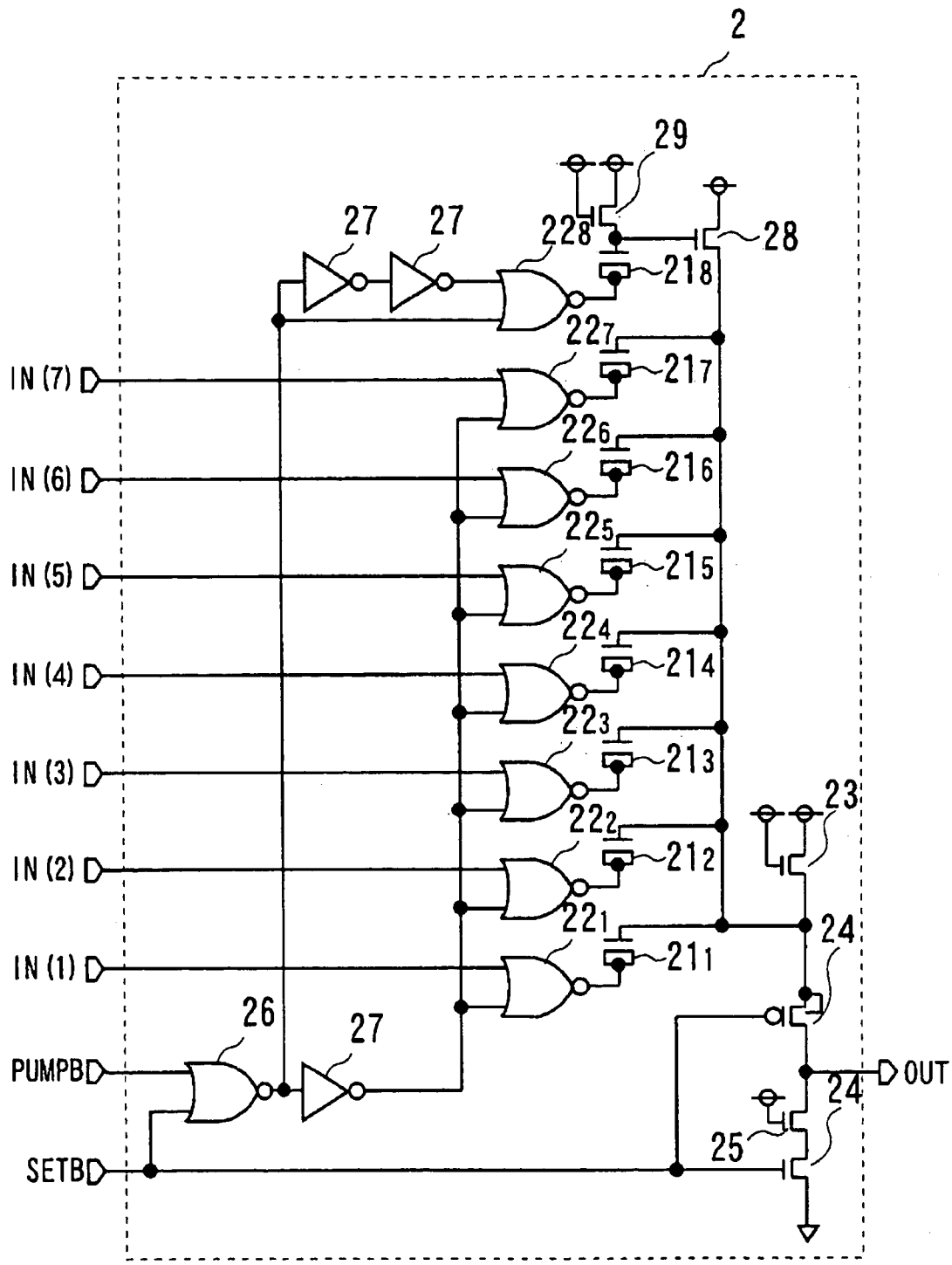
FIG. 10 shows another illustrative configuration of a leakage source gate potential generating circuit of FIG. 1.

The leakage source voltage generating circuit 2 (voltage boost-up circuit) may be configured as shown in FIG. 10. Referring to FIG. 10, the gates of the MOS capacitors $21_1$ to $21_7$, composing the boost capacitance, are connected in common by a common connection line having an end connected to a node at which the inverter 24 and the source of the nMOSFET 23 are coupled and having the opposite end connected to the source of the nMOSFET 28, the drain of which is connected to the power supply VCC. The gate of the nMOSFET 28 is connected to the source of the nMOSFET 29 having the drain and the gate connected to the power supply VCC. There is provided a NOR circuit $22_8$ which receives an output of the NOR circuit 26 and a signal corresponding to an output of the NOR circuit 26 delayed by the two-stage inverter 27. An output of the NOR circuit $22_8$ is connected via MOS capacity $21_8$ to the gate of the nMOSFET 28.

During the low level period of the signal PUMPB plus the delay time of the two-stage inverter 27, the NOR circuit $22_8$ is at a low level and boosting up by the MOS capacity $21_8$ is not carried out. Except during this period, boost-up by the MOS capacity 218 is carried out and, by the nMOSFET 28, the gate of which is supplied with the boosted voltage, the voltage of the common gate connection line of the MOS capacitors $21_1$ to $21_7$ is raised. Meanwhile, during the low level period of the signal PUMPB, boost-up is carried out by the boost capacity $21_n$ with the input signal IN(n) (n=0 to 7) low.

Figure 12:
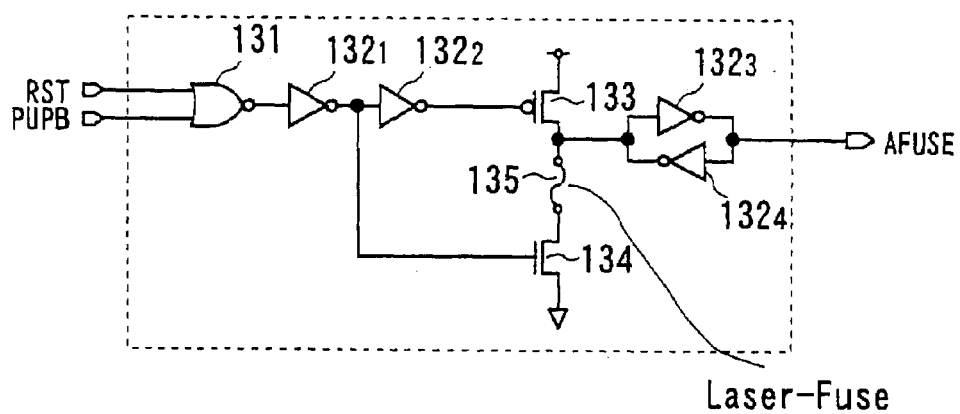
FIG. 12 shows an illustrative configuration of a fuse ROM circuit prior to rupturing.

FIG. 12 shows the configuration before cutting the fused ROM in the circuit outputting the fuse signal AFUSE. In the present embodiment, this circuit is preferably integrated on the same chip on which a memory along with the cell leakage monitor circuit is formed.

Referring to FIG. 12, the circuit includes a NOR circuit 131 which receives a reset signal RST and a power up signal PUBB, inverters $132_1$ and $132_2$, an nMOSFET 134 which has a gate supplied with an output of the inverter $132_1$, has a source grounded and has a drain connected to one end of a fuse 135, an nMOSFET 133 which has a gate supplied with an output of the inverter $132_2$, has a source connected to the power supply and has a drain connected to the other end of the fuse 135, and a flip-flop which is made up of an inverter $132_3$ and an inverter $132_4$ having input and outputs connected together and which receives the drain voltage of the pMOSFET 133 and outputs the output signal AFUSE.

If, in FIG. 12, the reset signal RST and the power-up signal PUPM are both low, the output of the NOR circuit 131 is high, the outputs of the inverters $132_1$ and $132_2$ are low and high, respectively, with the pMOSFET 133 and the nMOSFET 134 being off. With the power-up signal PUPB or the reset signal RST high, the output of the NOR 131 is low, the outputs of the inverters $132_1$ and $132_2$ are high and low, respectively. The pMOSFET 133 and the nMOSFET 134 are both turned on and, in the present embodiment, the output AFUSE of the flip-flop goes high. It is noted that the drain voltage of the pMOSFET 133 is a voltage obtained on dividing the power supply voltage VCC with the on-resistance of the pMOSFET 133 and the sum of the resistance of the fuse 135 and the on-resistance of the pMOSFET 134. In the present embodiment, the flip-flop output AFUSE is high.

Figure 13:
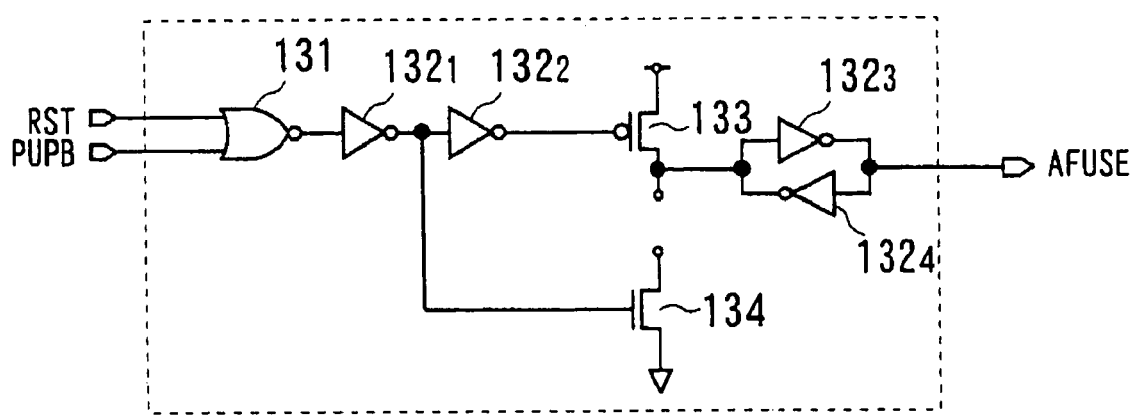
FIG. 13 shows an illustrative configuration of the fuse ROM circuit subsequent to rupturing.

FIG. 13 shows the post-rupture configuration of the fuse ROM. In FIG. 13, with the reset signal RST and the power-up signal PUPB both low, the output of the NOR 131 is high and the output of the inverter $132_2$ is high, with the pMOSFET 133 being turned off. With the power-up signal PUPB or RST high, the output of the NOR 131 is low, the output of the inverter $132_2$ goes low and the pMOSFET 133 is turned on, with the drain node of the pMOSFET 133 being the power supply voltage VCC and with the flip-flop output AFUSE going low. With the signal RST high, the outputs of the NOR circuit 131 and the inverter $131_2$ are low, such that the pMOSFET 133 is turned on and the flip-flop outputs a low level as the signal AFUSE.

Figure 14:
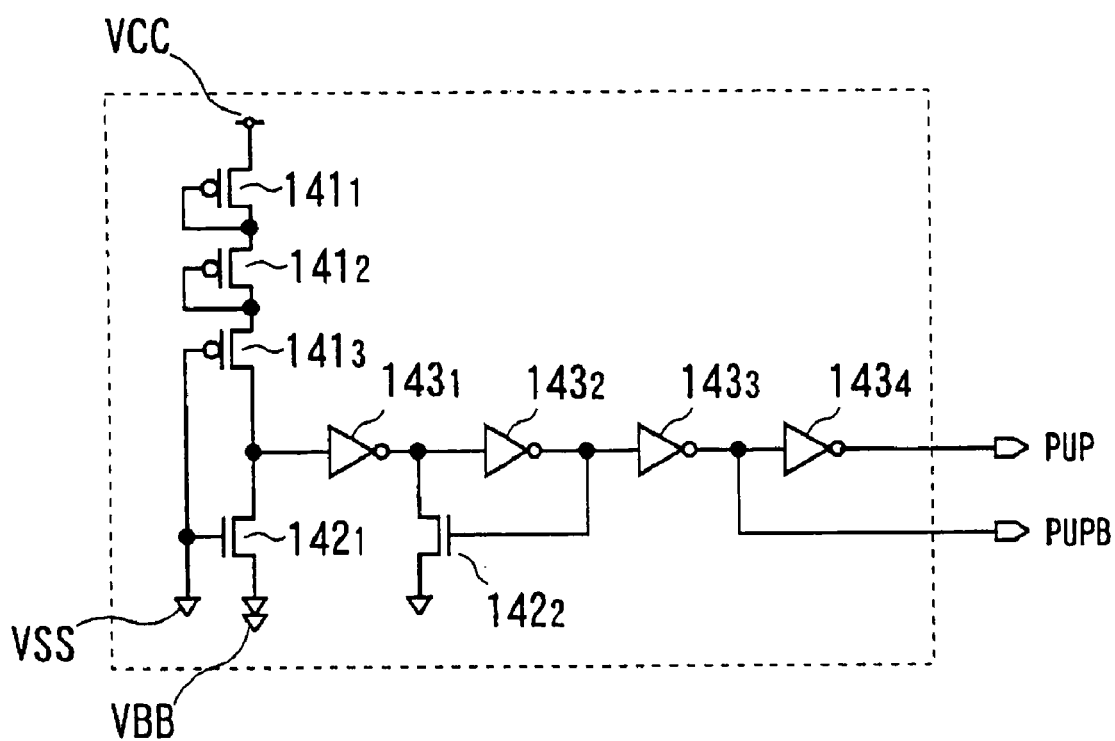
FIG. 14 shows an illustrative configuration of a PUP circuit for generating a signal PUPB of FIGS. 12 and 13.
Figure 15:
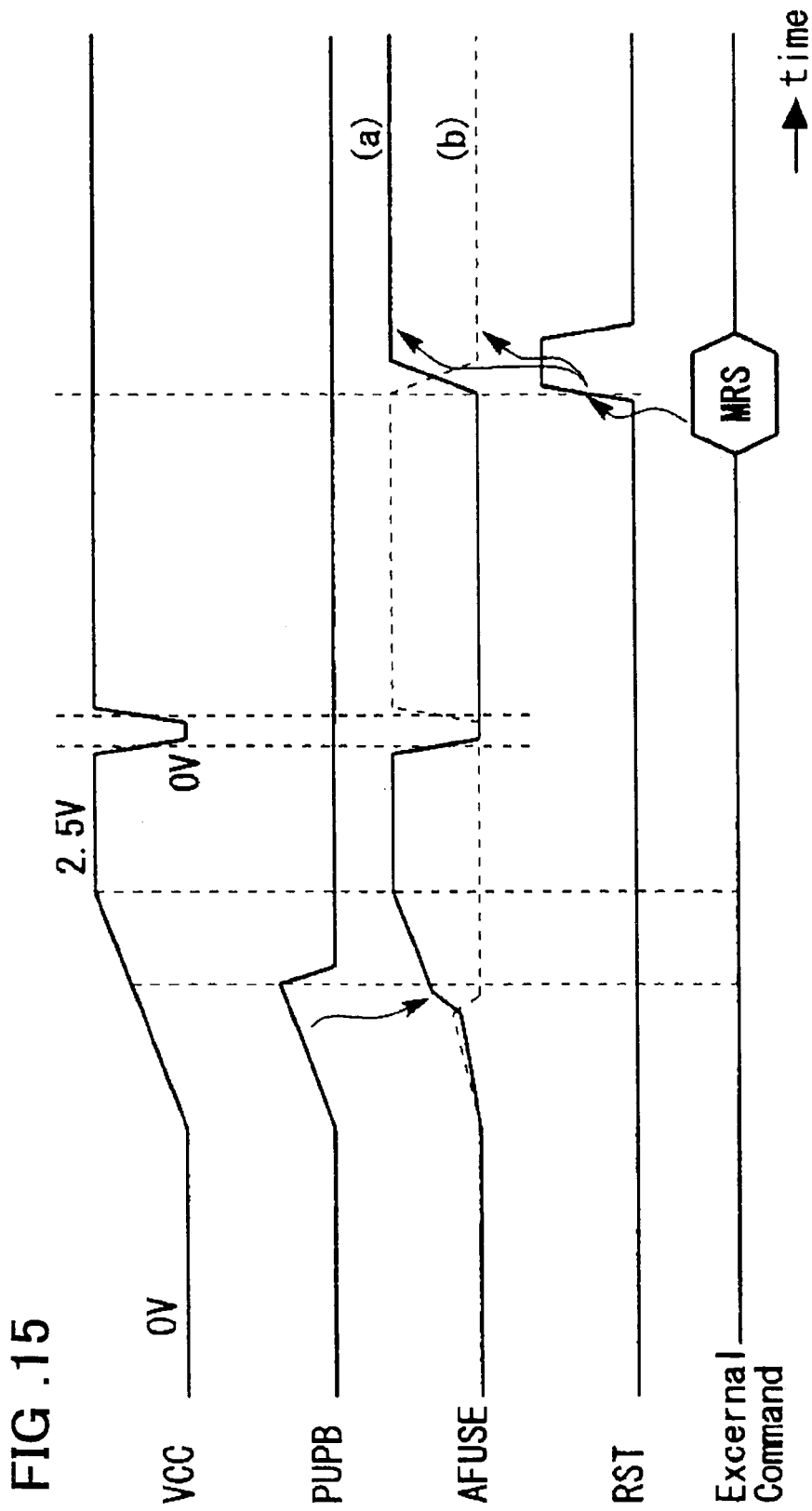
FIG. 15 shows an example of an operational waveform of a fuse ROM circuit (on power up and on status establishment by inner reset).

FIG. 14 shows a configuration of a power-up detection circuit outputting the power-up signal PUPB and PUP of FIG. 12. The power-up detection circuit, shown in FIG. 14, outputs, as PUPB, a signal waveform shown in FIG. 15 in case the power supply voltage is raised to a preset value during the time the power supply is on. FIG. 15 shows a signal waveform of PUMPB and AFUSE in case the state is established by internal reset (RST) on power up of the power supply (VCC). In FIG. 15, the signal AFUSE, output from the circuit of FIG. 12, is shown by a solid line (AFUSE(a)), while the signal AFUSE, output from the circuit of FIG. 13, is shown by a broken line (AFUSE(b)).

In FIG. 14, a cascaded connection of pMOSFETs $141_1$ and $141_2$, each having a gate and drain connected (diode connection), a pMOSFET $141_3$ and an nMOSFET $142_1$, each having a gate connected common to the low power supply (ground potential) VSS, are connected in series across a power supply terminal VCC and a memory array substrate voltage VBB. The drain of the pMOSFET $141_3$ and the drain of the nMOSFET $142_1$ are connected in common to an input of buffer string made up of inverters $143_1$ to $143_4$. The signal PUP is output from the output of the inverter $143_4$ and the inverted signal PUPB is output from an output of the inverter $143_3$. Across the output of the inverter $143_1$ and VSS is connected an nMOSFET $142_2$. The output of the inverter $143_1$ is entered to the gate of the nMOSFET $142_2$.

Referring to FIGS. 14 and 15, at a time point 0 V of the power supply voltage VCC has a started to rise on power up, the pMOSFETs $141_1$, $141_2$ are turned off. The memory array substrate voltage VBB falls from zero to a minus voltage. When the gate-to-source voltage rises above a threshold voltage, the nMOSFET $142_1$ is turned on and the input voltage of the inverter $143_1$ falls to a low level. The output of the inverter $143_1$ is raised slightly and the signal PUMP begins to be raised once. When the power supply voltage VCC is raised further, the pMOSFETs $141_1$, $141_2$ and $141_3$ are turned on. The input voltage of the inverter $143_1$ is a voltage corresponding to voltage division of the power supply voltage VCC by the on-resistance of the pMOSFETs $141_1$, $141_2$, and $141_3$ and the on-resistance of the nMOSFET $142_1$, and the output of the inverter $143_1$ falls, while the PUPB also falls.

In the fuse ROM shown in FIG. 12, with increase in the power supply voltage VCC during power up, the signal AFUSE is of the waveform shown by the solid line in FIG. 15. The signal RST is at a low level, while the output of the NOR 131 goes low with rising transition of the signal PUPB. The inverter $132_1$ is at a high level, while the output of the inverter $132_2$ is at a low level. The input voltage of the inverter $132_3$ is of a value corresponding to the voltage division of the power supply voltage VCC by the on-resistance of the pMOSFET 133 and the sum of the resistance of the fuse 135 and the on-resistance of the nMOSFET 134. When the power-up signal PUPB changes from a high level to a low level, the output NOR 131 goes high, the output of the inverter $132_1$ goes low and the output of the inverter 132₂ goes high, such that the pMOSFET 133 and the nMOSFET 134 are both turned off and the output signal AFUSE rises with increase in the power supply voltage VCC. If, after the power supply is turned off (VCC=0V), the power supply is turned on, the output signal AFUSE of the inverter 132₃ remains low. The reset pulse RST is output by a mode register setting command MRS entered to the memory SDRAM, with the signal AFUSE being set to a high level (see solid line (a) in FIG. 15.

In the fuse ROM shown in FIG. 13, with increase in the power supply voltage VCC during power up sequence, the signal AFUSE is of the waveform shown by the solid line in FIG. 15. When the signal PUPB changes from a low level to a high level with the signal RST being at a low level, the output of NOR 133 goes low, while the output of the inverter 132₁ is at a high level and the output of the inverter 132₂ is at a low level to turn on the pMOSFET 133. The output signal AFUSE of the inverter 132₃ is at a low level. As the signal PUPB changes from a high level to a low level, the output of the NOR 131 is at a high level, the output of the inverter 132₁ is at a low level, the output of the inverter 132₂ is at a high level, the pMOSFET 133 is turned off and the signal AFUSE is at a low level. In case the power supply is momentarily turned off and then turned on, the output signal AFUSE of the inverter 132₃ is at a high level. As a mode register setting command MRS is entered to the SDRAM (synchronous DRAM), forming the memory of the present embodiment, a reset pulse signal RST is output, so that the signal AFUSE is set to the low level (see broken line (b) of FIG. 15).

Figure 16:
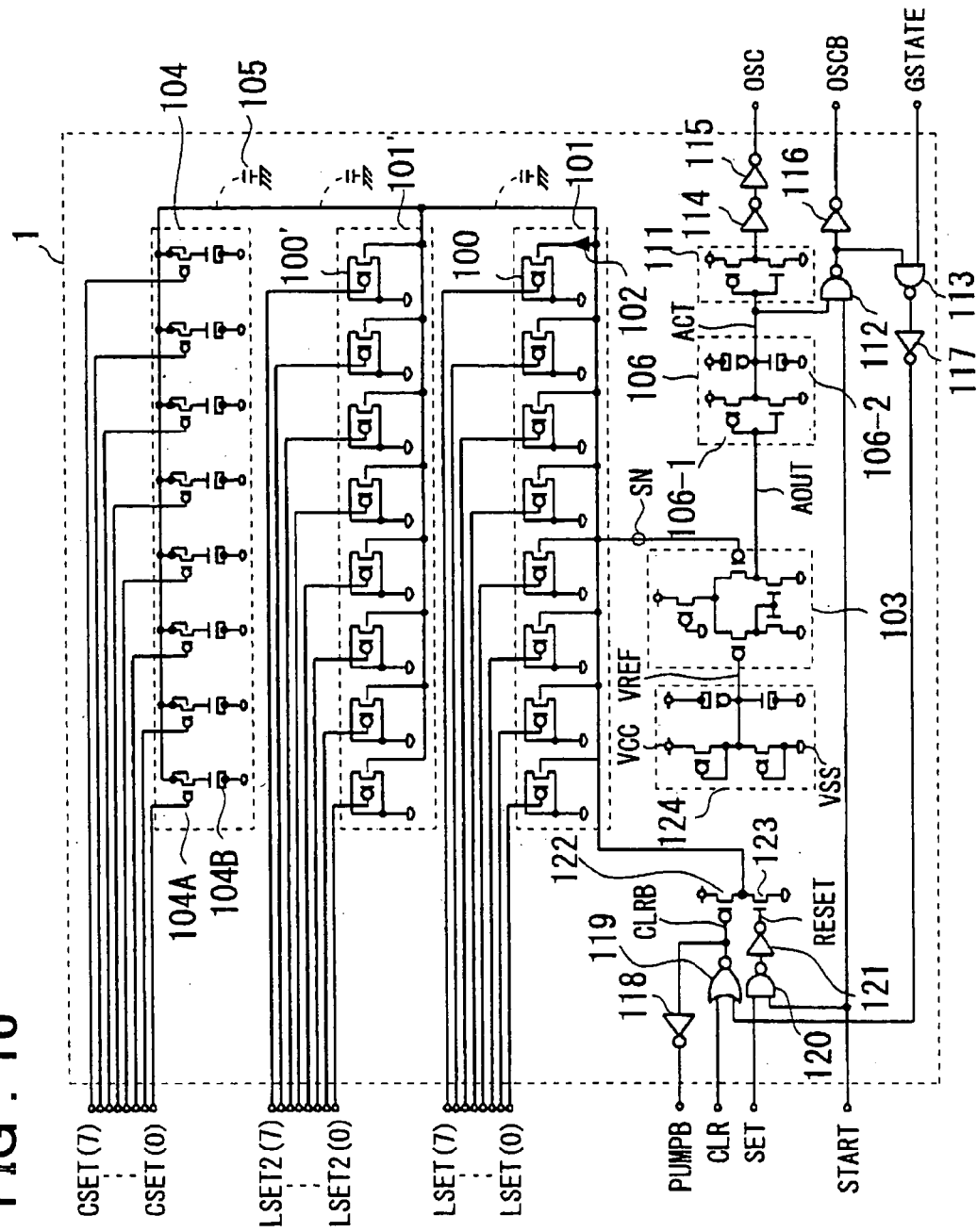
FIG. 16 shows an illustrative configuration of the main circuit of the cell leakage monitor of FIG. 1.

FIG. 16 shows a configuration of the main circuit 1 of FIG. 1. Referring to FIG. 16, a plural number of pMOSFET 104A, having sources connected in common and having gates respectively supplied with IN(0) to IN(7), and a plurality of MOS capacitors connected across VSS and the drains of the pMOSFETs 104A, constitute capacitors 104B for period adjustment.

A plural number of pMOSFETs 100, having gates respectively supplied with LSET(0) to LSET(7), having sources and drains connected to each other and to the ground, and having back-gates connected in common, compose a leakage source 101, while a plural number of pMOSFETs 100', having gates respectively supplied with LSET2(0) to LSET2(7), having sources and drains connected to each other and to the ground, and having back-gates connected in common, composes a leakage source 101'. The back gates of the pMOSFETs 100 and 100' of the leakage sources 101 and 101' and the sources of the pMOSFETs 104, operating as switches for period adjustment, are connected commonly to the node SN. The reference numerals 105 and 102 denote parasitic capacitances and leakage currents, respectively.

A reference voltage generating circuit 124 is made up by two pMOSFETs, cascade connected across the power supply VCC and the power supply VSS, in a diode configuration, and a pMOS capacitor and an n-MOS capacitor, having gates connected to a node at which the two cascaded pMOSFETs are connected.

A voltage comparator 103 is made up by a differential pMOSFET pair, having sources connected in common, a constant current source connected to the commonly coupled sources of the differential pMOSFET pair for providing a current to the differential pair, and a differential amplifier, composed of an nMOSFET current mirror, forming an active load of the differential pair. The voltage comparator is differentially receives the voltage at the node SN and an output VCC/2 (one half of the power supply voltage VCC) of the reference voltage generating circuit 124 to output the results of comparison as AOUT.

The output AOUT of the voltage comparator 103 is inverted by an inverting delay circuit 106 so as to be output via inverter 111 and two inverters 114 and 115 as a refresh signal OSC (an inverted signal of the output ACT of the delay circuit 6). The inverted signal of the output of a NAND circuit 112, which receives the output ACT and the signal START of the delay circuit 6 (non-inverted signal of the output ACT of the delay circuit 6), is output as a signal OSCB.

The result of AND operations on the output signal of the NAND circuit 112 and the signal GSTATE (by a NAND circuit 113 and an inverter 117) are supplied to a NOR circuit 119 along with a clear signal CLR. An output of the NOR circuit 119 is supplied to the gate of a pMOSFET 122, having a source connected to the power supply VCC, and a signal output from an inverter 118 which receives the output signal of the NOR circuit 119, is output as a boost control signal PUMPB to the leakage source voltage generating circuits 2 and 2' of FIG. 1. The result of AND operations on the signal SET and the signal START (by a NAND 120 and an inverter 121) is supplied to the gate of the source-grounded nMOSFET 123. The connection node of drains of the nMOSFET 123 and the pMOSFET 122 is connected to the node SN.

The operation of the main circuit 1 of the cell leakage monitor, shown in FIG. 16, will now be described. If, with the signal START high, the voltage of the node SN is lower than the reference voltage VREF, the voltage comparator 103 outputs a high level as an output signal AOUT. Hence, the output ACT of the inverting delay circuit 106 goes low, so that the signal OSC goes high through the inverters 111, 114 and 115. The NAND circuit 112, supplied with the low level signal ACT and with the high level signal START, outputs a high level, while the signal OSCB goes low.

The NAND circuit 113, supplied with the high level output of the NAND circuit 112 and with the high level signal GSTATE, outputs a low level and hence the output of the inverter 117 goes high. When the signal CLR is at a low level, an output of the NOR circuit 119 goes low to turn on the pMOSFET 122 to charge the node SN with the voltage VCELL. Hence, the voltage of the node SN is higher than the reference voltage VREF. The voltage comparator 103 outputs a low level as an output signal AOUT, and the output ACT of the inverting delay circuit 106 goes high, such that the signal OSC goes low from the high level through the inverters 111,114 and 115. That is, a one-shot pulse OSC is output. The signal OSCB goes high from the low level.

The NAND circuit 113, supplied with the low level output of the NAND circuit 112 and with the high level of the signal GSTATE, outputs a high level, so that the output of the inverter 117 goes low. When the signal CLR is at a low level (in an inactivated state), the output of the NOR circuit 119 goes high to turn off the pMOSFET 122 to set the node SN to the floating state. If the pMOSFET 122 is off (with the node SN in the floating state), the boost control signal PUMPB goes low.

When the electric charge in the node SN is decreased by the leakage current of the leakage source 101 until the voltage at the node SN has fallen to the reference voltage VREF, the signal OSC again goes high, so that the node SN is charged by the pMOSFET 122. With the signal CLR high, the node SN is charged.

With the signals START and SET high, the nMOSFET 123 is turned on to discharge the node SN.

Figure 17:
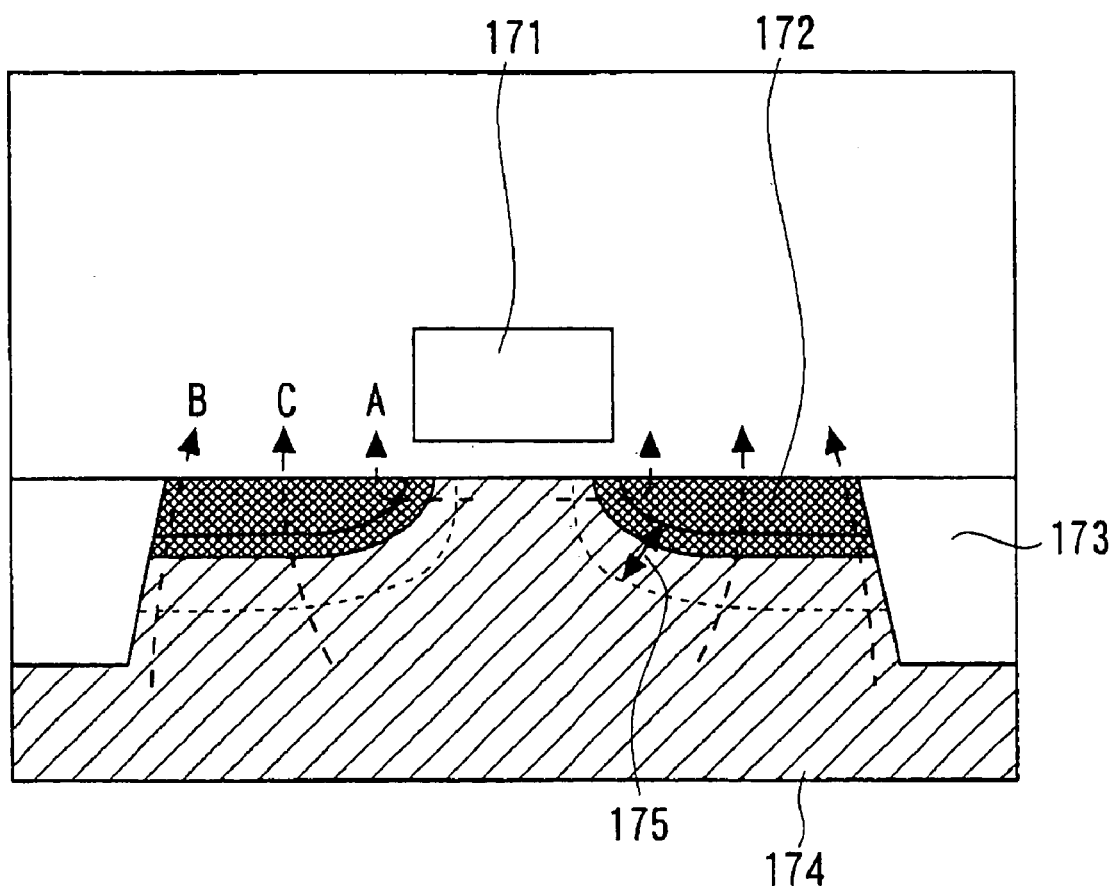
FIG. 17 is a schematic cross-sectional view of a leakage source (pMOSFET).

The GIDL (gate induced drain leakage current) of the pMOSFET of the leakage source 101 of FIG. 1 is now described. Referring to FIG. 17, the reference numerals 171, 172, 173, 174 and 175 denote a gate, a diffusion layer, a substrate isolation area (SGI), a substrate and a depletion layer, respectively. The reference symbols A, B and C denote a junction leakage gate end component, a junction leakage SGI (substrate isolation area) end component and a junction leakage plane component, respectively. The GIDL component is thought to be the leakage current flowing in an edge (A of FIG. 17) of a superficial gate layer affected by the gate potential. On the other hand, it is presumably the leakage current flowing in an interface having a high density of defects (C n FIG. 17) that is usually predominant.

Figure 18:
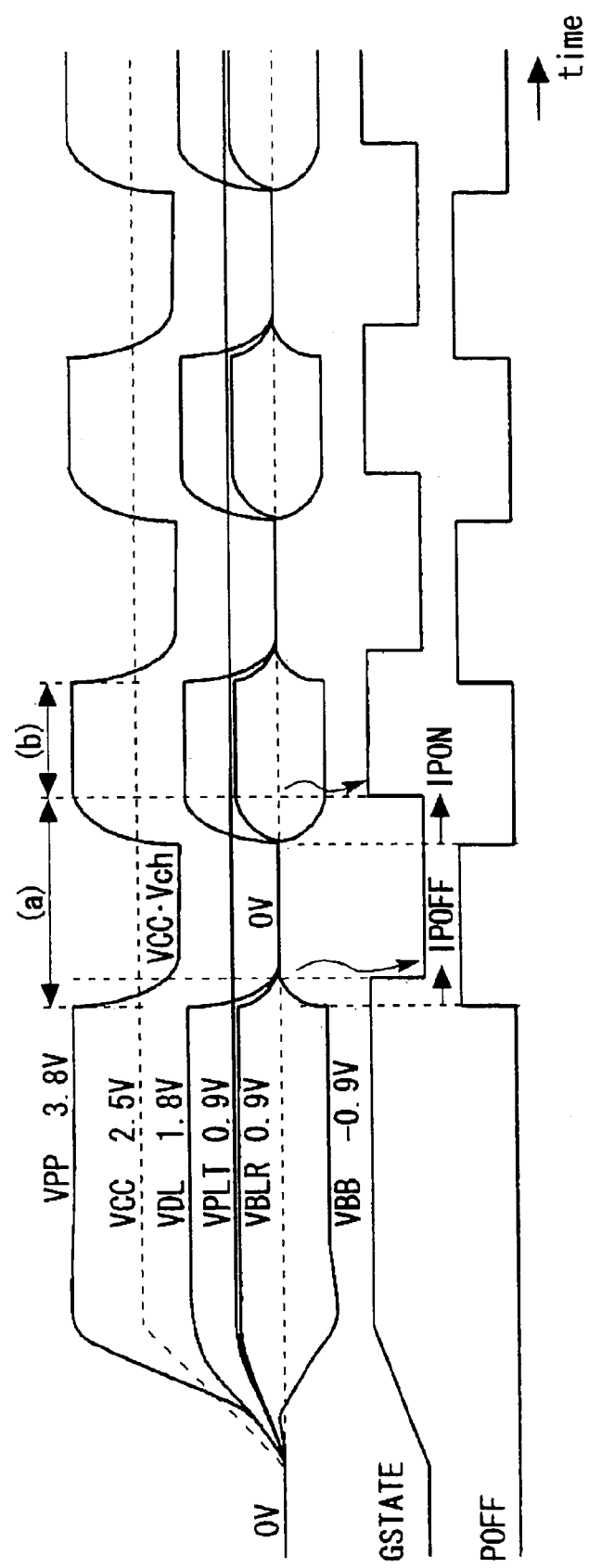
FIG. 18 shows an operational waveform of the inner current supply (on power up and during the power supply off mode).

FIG. 18 shows transitions of the signal GSTATE, POFF and various internal power supply voltage waveforms on power up and in the power supply off mode. n FIG. 18, VCC is the power supply voltage, VPP is a high voltage (word line boost-up voltage), VBB is a substrate electric potential of the memory cell array area, VDL is a bit line potential (memory cell write voltage), VBRL is a bit line precharge potential, equal to VDL/2, and VPLT is a plate potential equal to VDL/2. In the power supply off mode, with the signal POFF high (the voltage of the power supply VCC is kept), the high voltage VPP falls to VCC-th, VDL, VPLT, VBLR and VBB are 0V, and the signal GSTATE goes low, based on changes in the internal power supply voltage (IPOFF). With restoration of the internal power supply voltage, the signal GSTATE is at a high level (IPON). The power supply off mode will be described subsequently.

Figure 19:
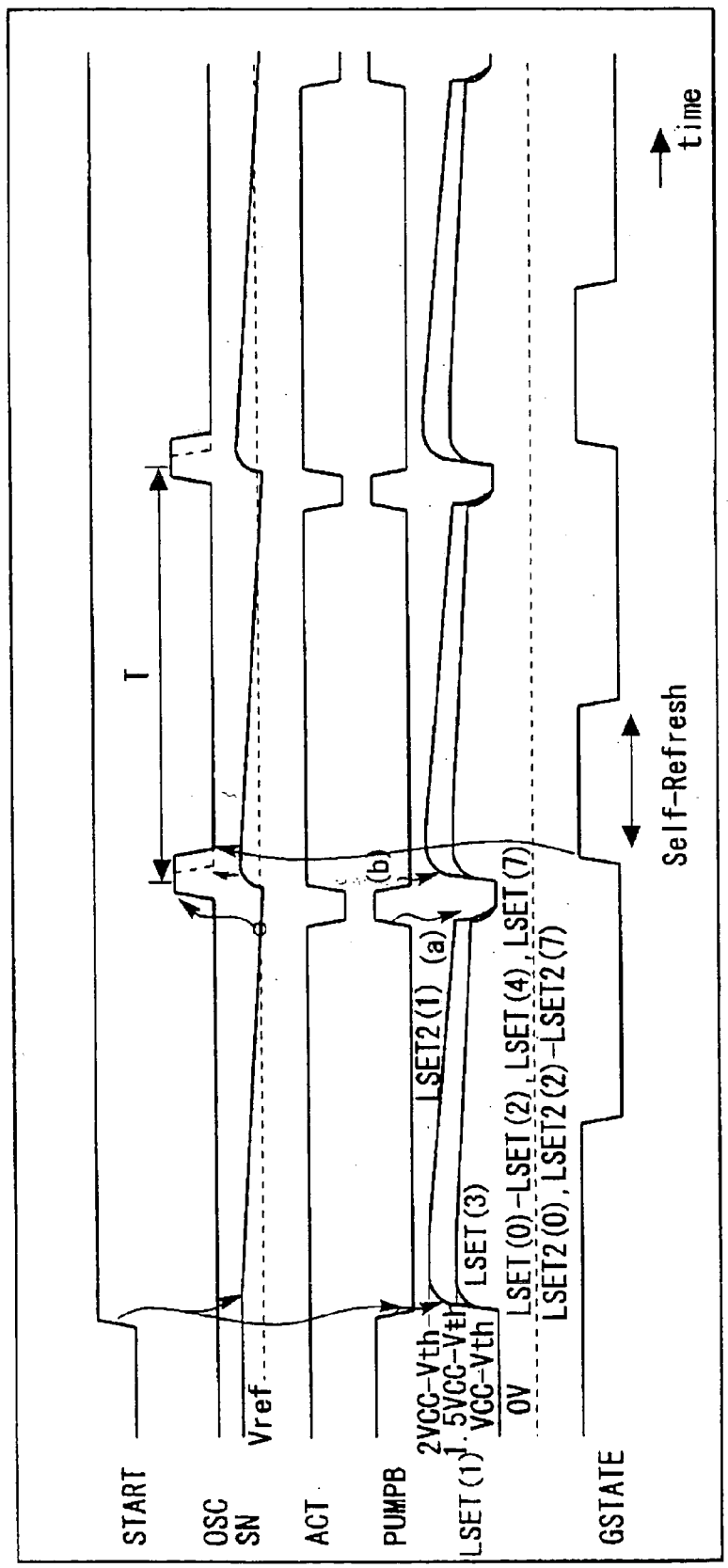
FIG. 19 shows an example of an oscillation waveform of the cell leakage monitor of FIG. 1.

FIG. 19 shows signal waveforms showing oscillation operation of the main circuit 1 of the cell leakage monitor (operation of outputting pulses of the refresh signal OSC). When the lowering of the potential at the node SN is detected by the voltage comparator 103 and the signal ACT is at a low level, the signal OSC goes high to charge the node SN, with the signal OSC going low (the signal OSC is output with a delay as from the rise timing of SN). This sequence of operations is repeated, such that the pulse signal OSC is output periodically (with a period of T). With the boost control signal PUMPB active (low), the voltages LSET(0) to LSET(7) and LSET2(0) to LSET2(7) from the leakage source voltage generating circuits 2 and 2' (rising voltage 2 VCC-Vth and rising voltage 1.5 VCC-Vth) are output. Responsive to the rise of the boost control signal PUMPB to the high level, the leakage source voltage generating circuits 2 and 2' set the LSET(0) to LSET(7) and LSET2(0) to LSET2(7) to the ground potential. During the high level period of the GSTATE, the memory cell is re-written by self-refresh.

Figure 20:
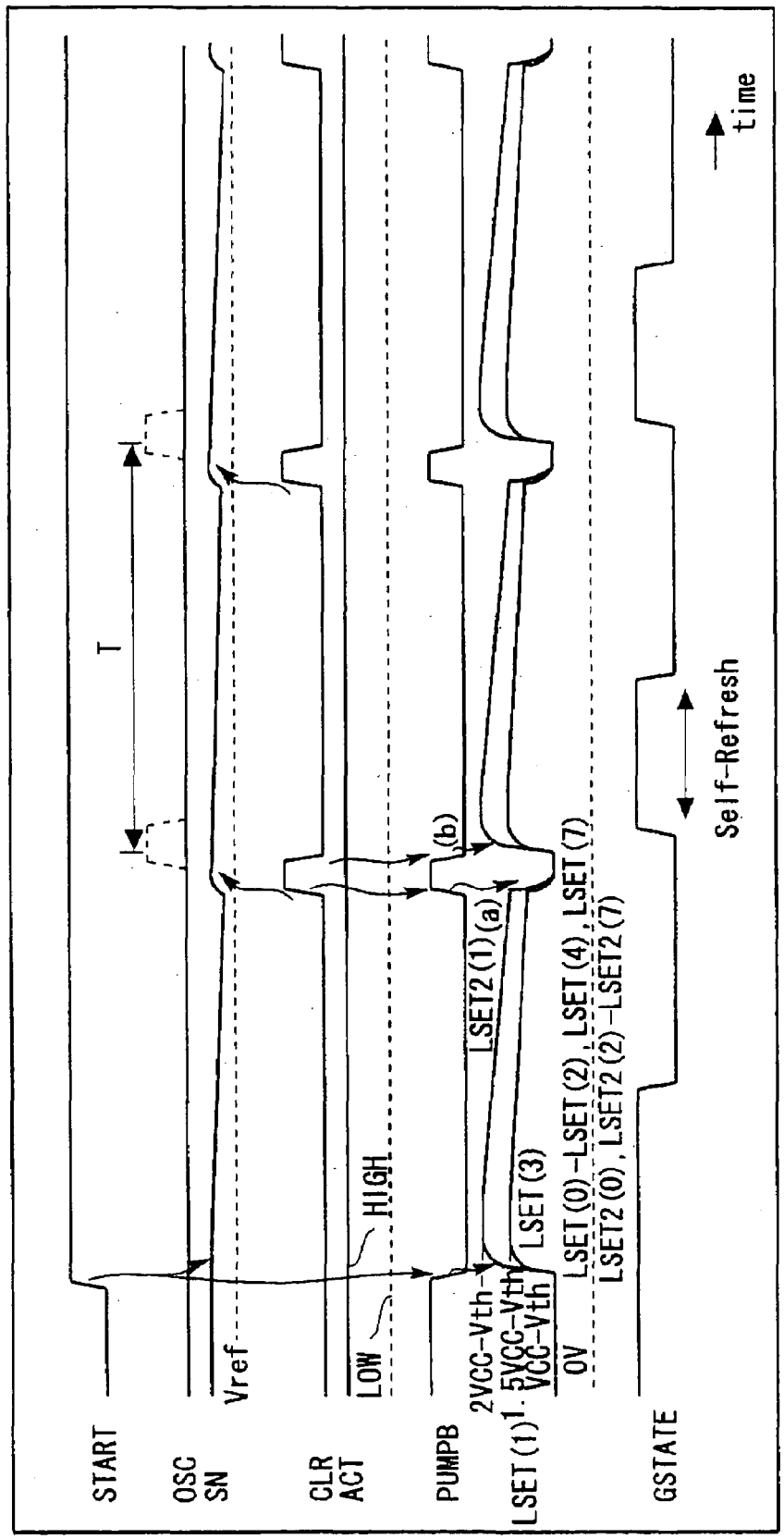
FIG. 20 shows an example of an oscillation waveform of the cell leakage monitor of FIG. 1.

FIG. 20 illustrates another exemplary operation of the oscillation operations of the main circuit 1 of the cell leakage monitor shown in FIG. 16. In case the period of the refresh pulse signal OSC is too long (that is, when the output ACT of the voltage comparator 103 is high and no pulse signal OSC is output), the clear signal CLR is set to a high level and the nMOSFET 123 is turned on to charge the node SN.

Figure 21:
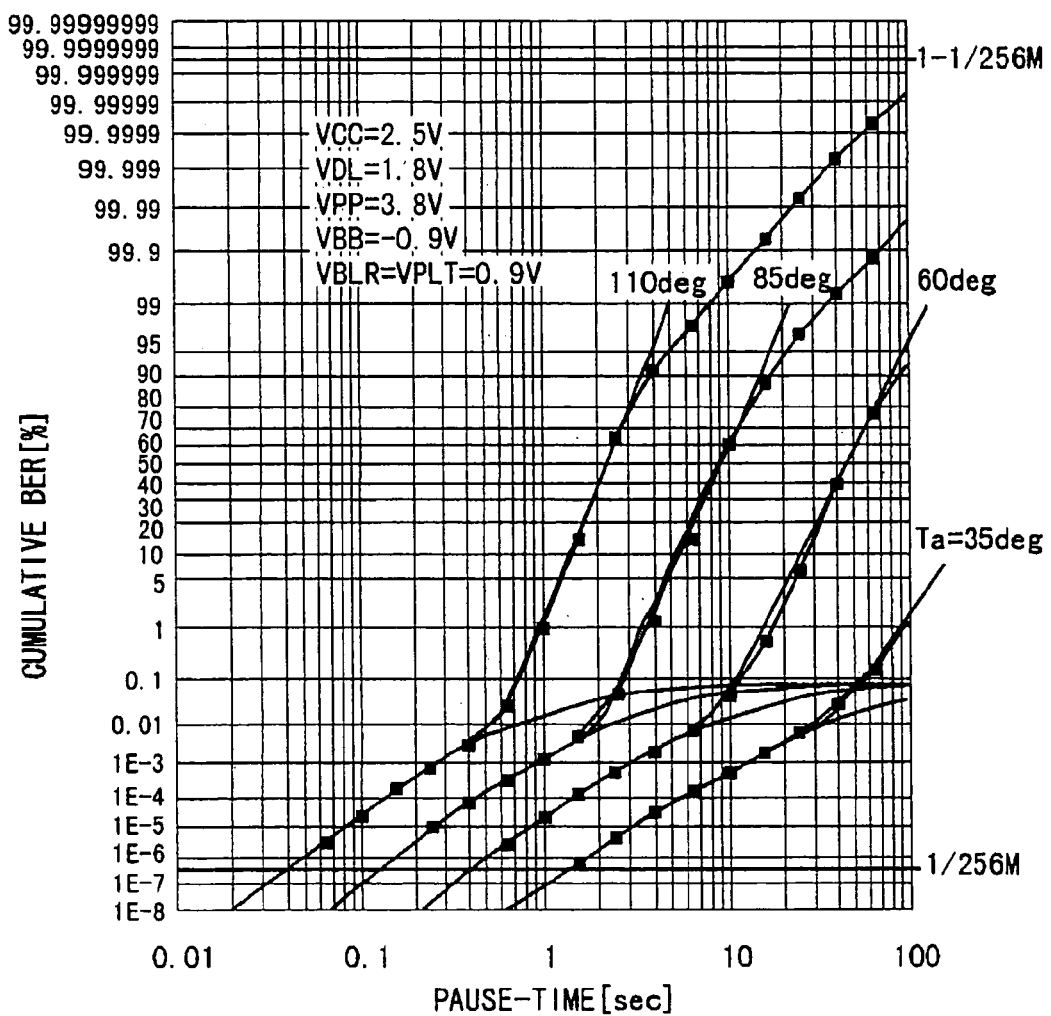
FIG. 21 shows temperature dependency of pause refresh characteristics.

FIG. 21 shows the temperature dependency of the pause refresh characteristics. In FIG. 21, the abscissa (x-axis) shows pause time (PAUSE-TIME) and the ordinate (y-axis) shows the normalized cumulative number of fail bits (the number of bits indicating data retention failure/the total number of bits under test). As shown in FIG. 21, there is a major distribution termed normal bits and a minor distribution termed tail bits. 1/256M means the worst one bit of 1/256M in case of a DRAM of a memory capacity of 256 Mbits, with 1−(1/256M) denotes the best one bit.

As may be seen from FIG. 21, the pause refresh characteristics represent marked temperature dependency, such that, at lower temperatures, the 'real power' or 'ability' increases in orders of magnitudes of digits. Since the temperature dependency (activation energy) for the tail bits differs from that for the normal bits approximately by a factor of two, the difference in the 'real power' increases as the temperature becomes lower. That is, the above-described embodiment is applied for adapting the refresh period at the self-refresh time to temperature characteristics.

Figure 22:
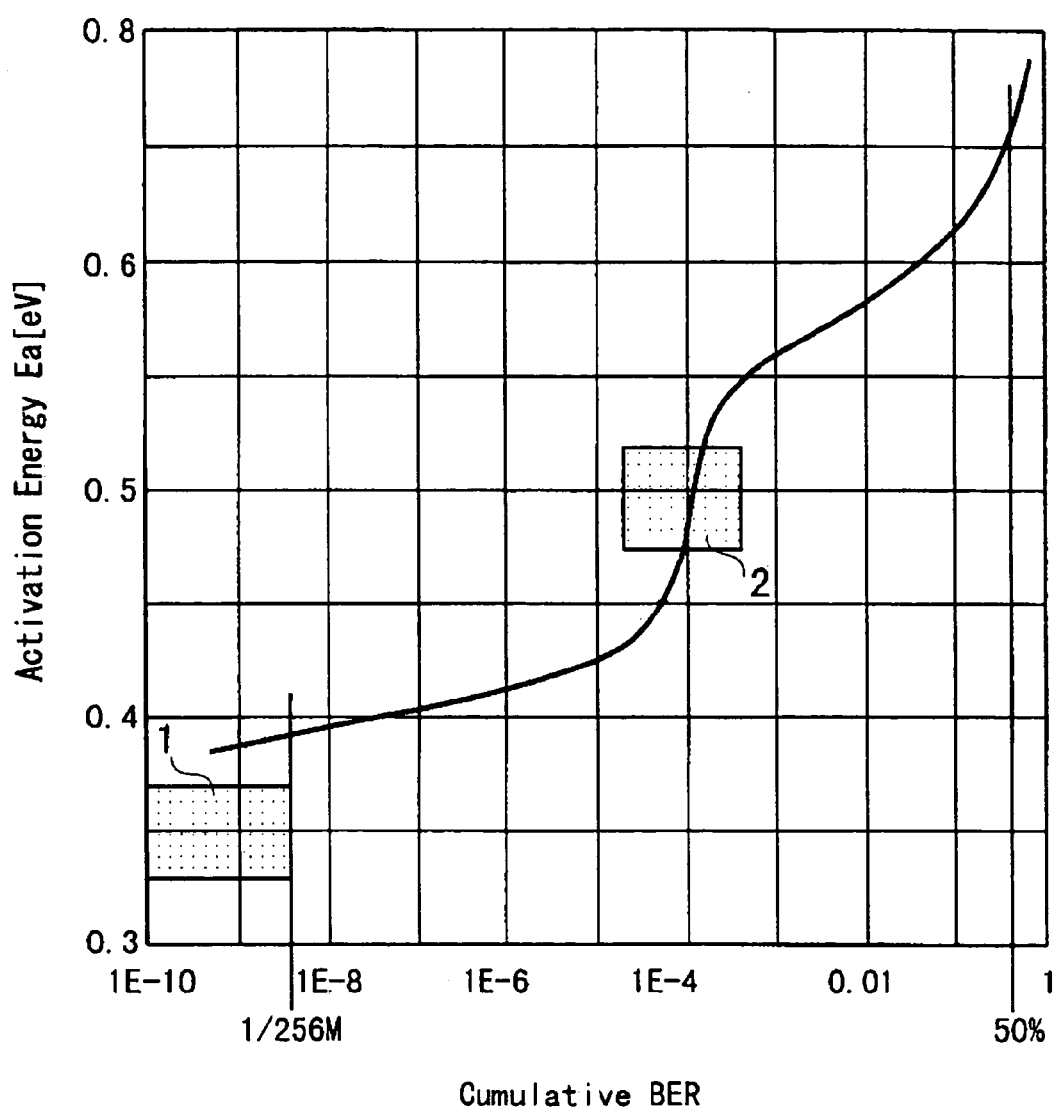
FIG. 22 shows the correlation between the bit error rate BER and the activation energy.

FIG. 22 shows the relationship between the cumulative bit errors and the activation energy. In this figure, rectangular areas 1 and 2 indicate the relationship for normal refresh and that for super self-refresh, respectively.

Figure 23:
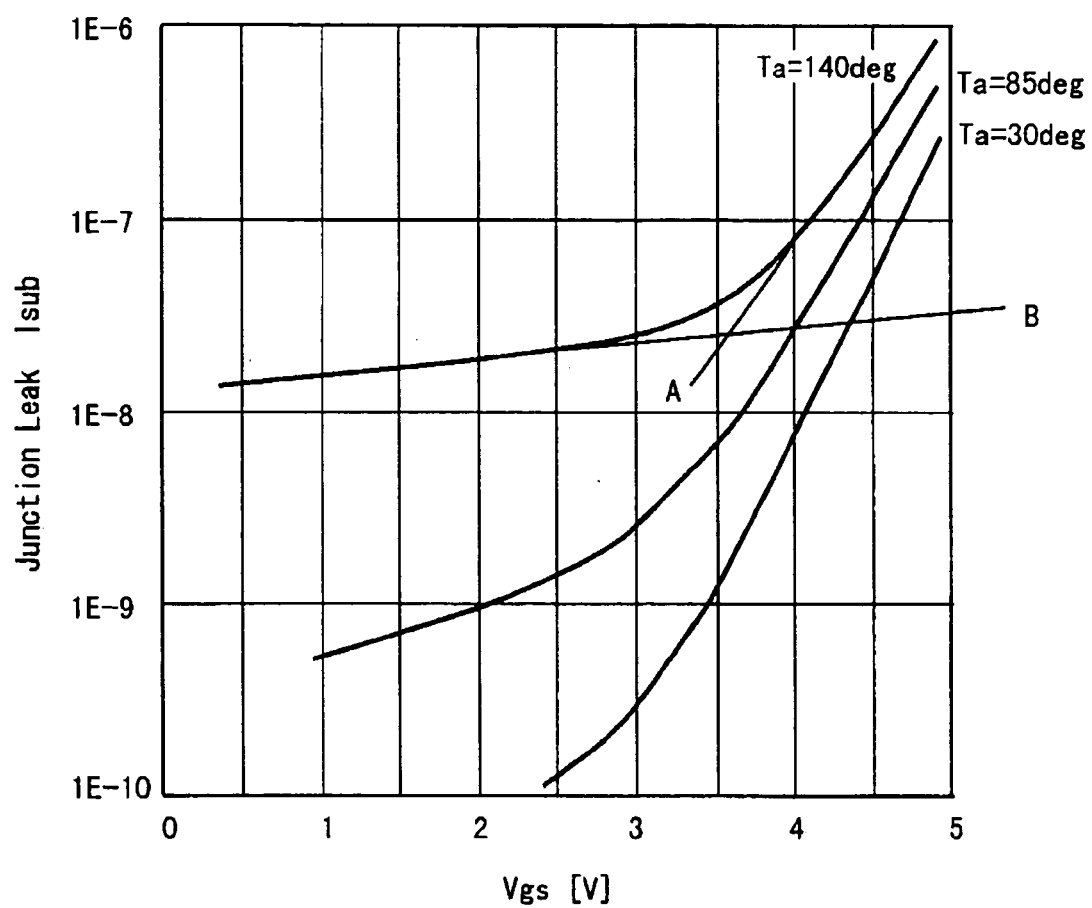
FIG. 23 shows the gate voltage dependency of the leakage current of FIG. 17.

FIG. 23 shows a graph representing the gate-to-source voltage (Vgs) dependency of the leakage current. When the gate-to-source voltage Vgs becomes higher, the junction leakage current Isub is increased.

Figure 24:
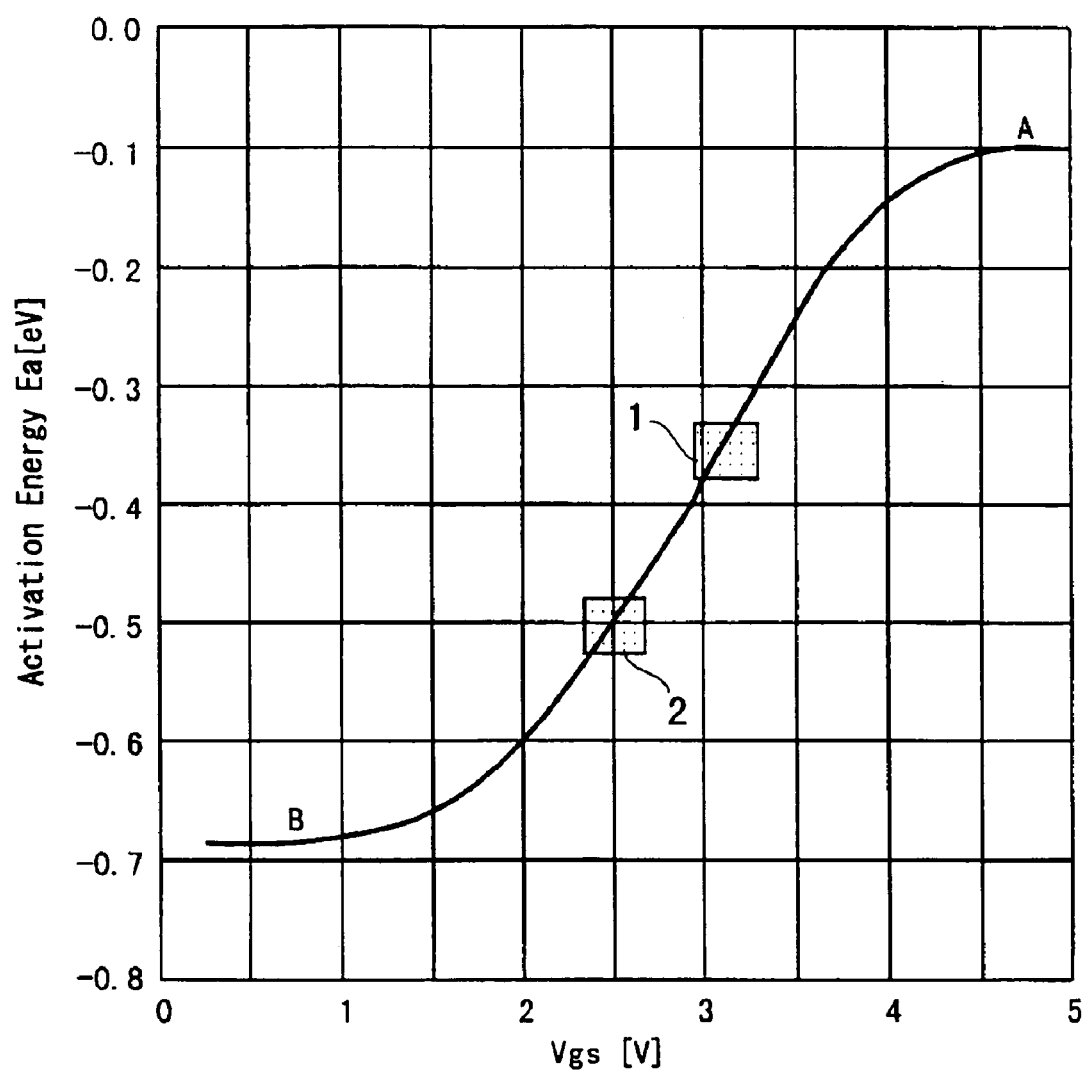
FIG. 24 shows the gate voltage dependency of the leakage current and temperature characteristics of FIG. 17.

FIG. 24 shows a graph illustrating the gate voltage dependency of the leakage current temperature characteristics (activation energy). The gate end mode (A) is dominant, with the current increasing in orders of magnitudes of digits with increasing gate potential. The activation energy is lowered lineally to approximately 0.1 eV. It is noted that the BBT (band-to-band tunnel) current is generated by the strong electric field at the gate end. By these leakage characteristics, the refresh period (reciprocal of the leakage current) and the temperature dependency can be set freely.

Figure 25:
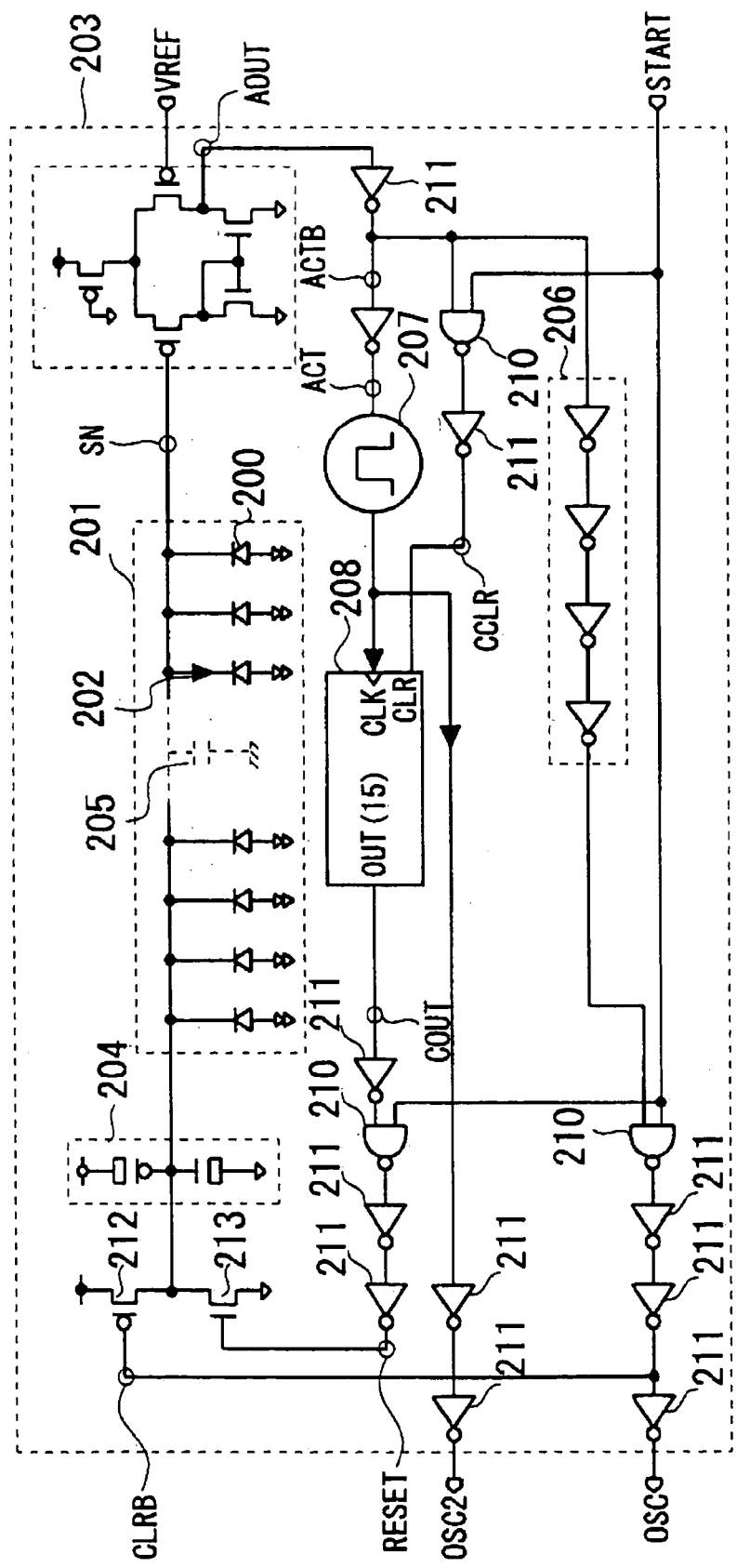
FIG. 25 shows an illustrative configuration of a cell leakage monitor circuit of a second embodiment of the present invention.

The second embodiment of the present invention is now described. FIG. 25 shows the configuration of the second embodiment of the present invention. In the present embodiment, the cell monitor circuit exercises control so that the refresh pulse period will not be longer than a fixed period. This fixed period is controlled by a timer composed of an oscillator circuit 207 and a counter 208.

Figure 32:
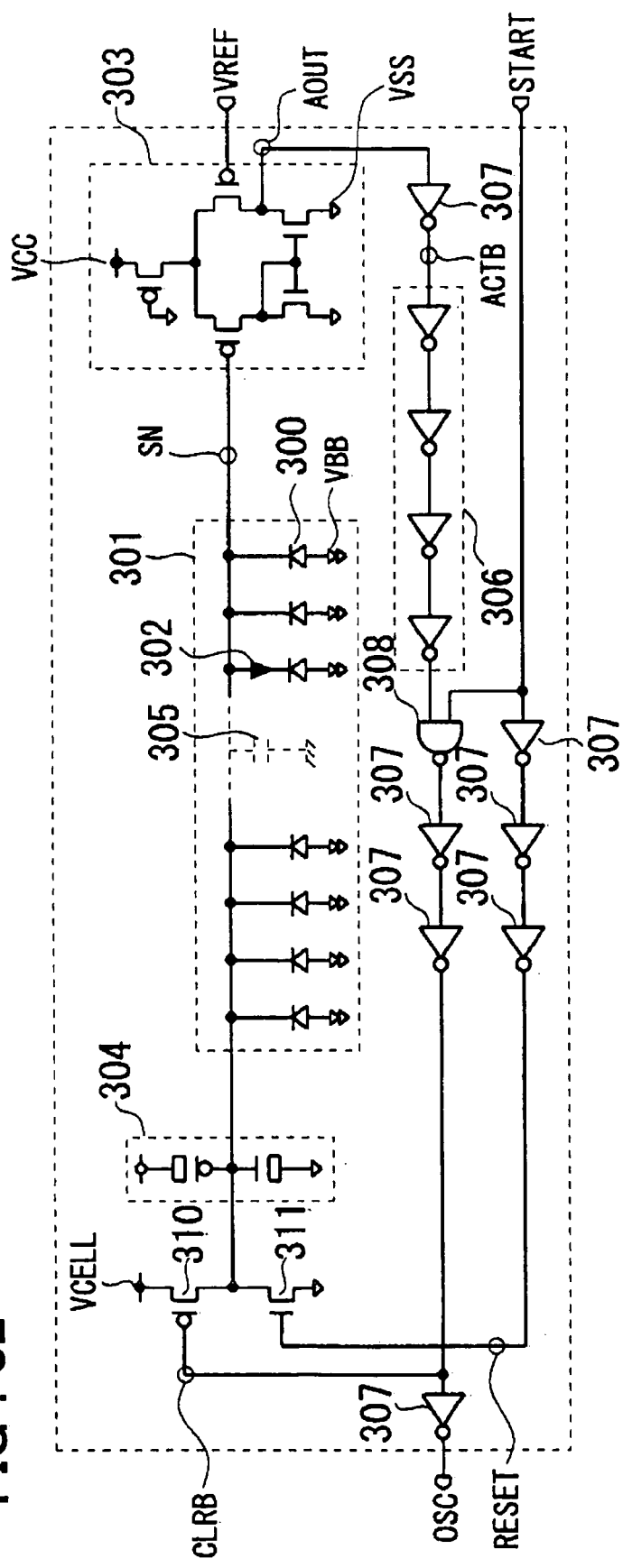
FIG. 32 illustrates the basic configuration of the cell leakage monitor circuit.
Figure 33:
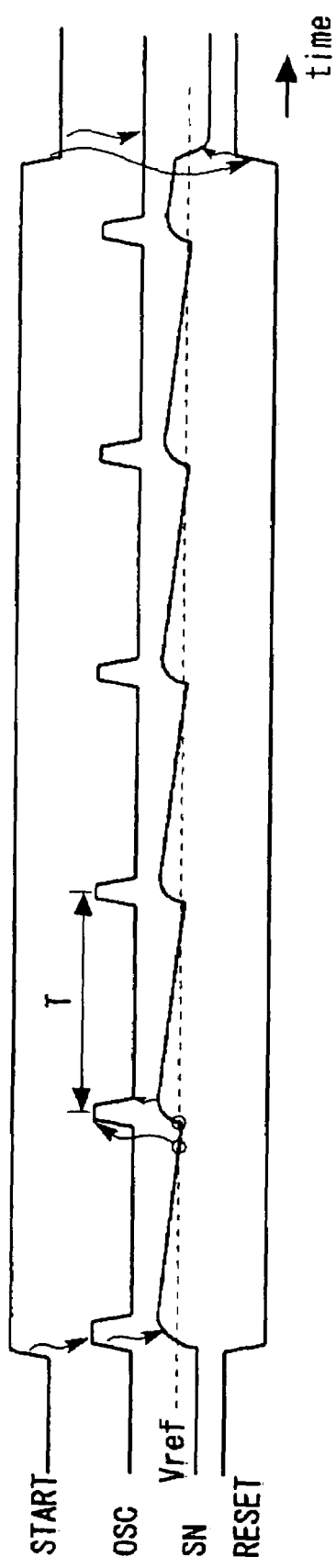
FIG. 33 shows an example of a basic operational waveform of the cell leakage monitor circuit of FIG. 32.

Referring to FIG. 25, the present embodiment includes, as the cell monitor circuit employing a PN junction device (see FIG. 32), the oscillator circuit 207, oscillating at a predetermined frequency when the output AOUT of a voltage comparator 203 is at a high level, and the counter 208, receiving and counting oscillation output clocks of the oscillator circuit 207 to output COUT when a preset number of output clocks have been counted. The signal RESET goes low when the start signal START is high and the output COUT of the counter 208 is low. On the other hand, when the counter 208 has counted the output oscillation clocks of the oscillator circuit 207 and has set the output COUT to a high level, the nMOSFET 123 is turned on to discharge the charges stored in the node SN. In this manner, the output AOUT of the voltage comparator 203 goes low, while the ACTB goes high and is delayed by the delay circuit 206 to set the signal OSC to a high level. The signal ACT goes low so that oscillations of the oscillator circuit 207 come to a close. On the other hand, the signal CLRB goes low to turn on the pMOSFET 212 to charge the node SN. The output AOUT of the voltage comparator 203 goes high, while OSC goes low.

Figure 26:
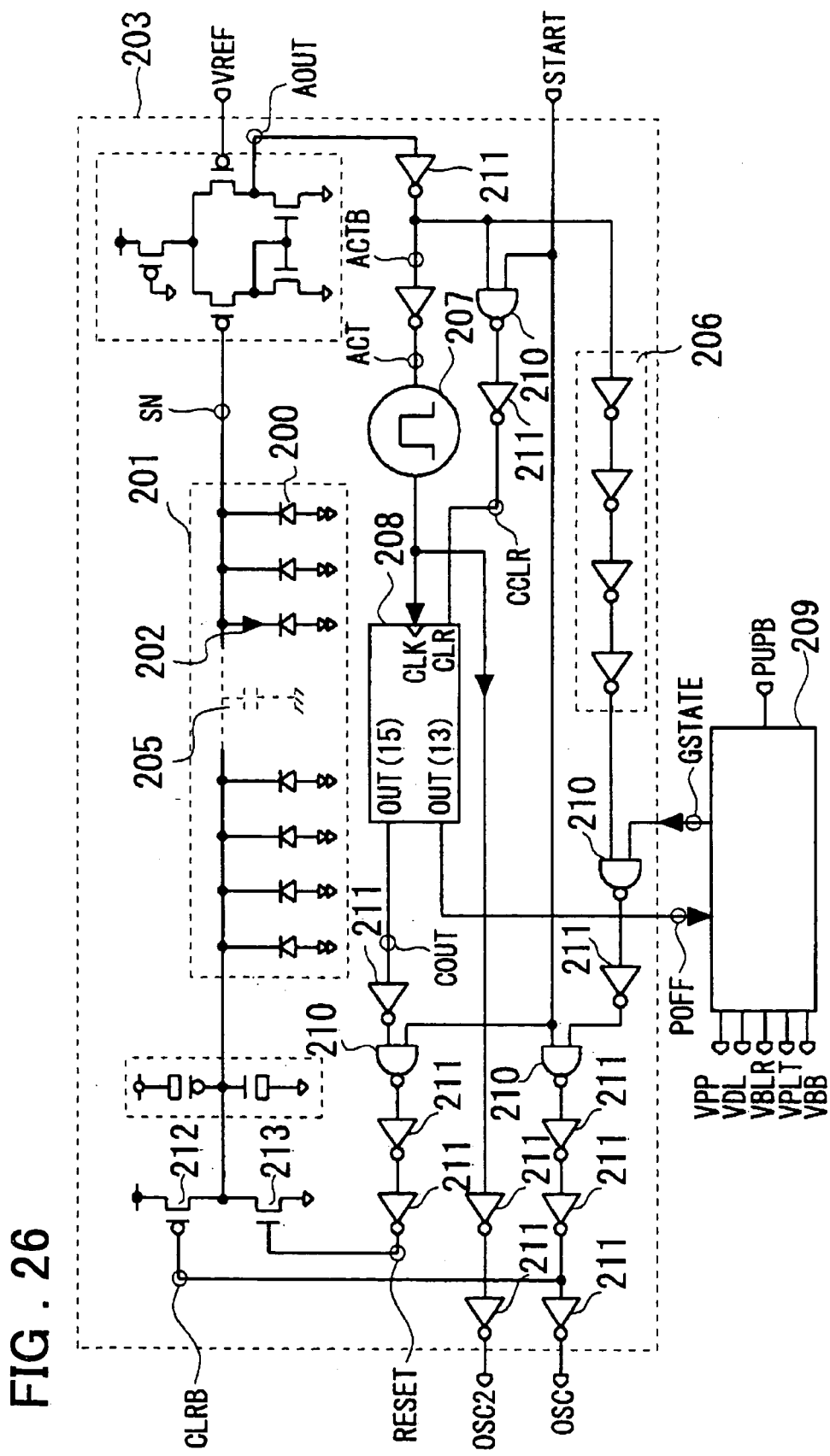
FIG. 26 shows an illustrative configuration of a cell leakage monitor circuit of a third embodiment of the present invention.

FIG. 26 shows the configuration of a third embodiment of the present invention. In FIG. 26, an internal power supply circuit 209 is added to the configuration of FIG. 25. The internal power supply circuit 209 receives the signal POFF (power supply off-mode control signal) from the counter 28 and performs control (power supply off-mode control) of a variety of internal power supply voltages, including a high voltage VPP, as a power supply voltage of e.g. a memory cell array, a bit line potential VDL, a bit line precharge potential VBLR, a plate potential VPLT, and a substrate potential VBB, with the power supply voltage VCC remaining e.g. at 2.5 V. The internal power supply circuit 209 also performs control that after checking to see that the internal power supply voltage is restored, the signal GSTATE is output (see FIG. 18). The result of the AND operation on the signal GSTATE from the internal power supply circuit 209 and on a delayed signal of the ACTB (the result of the AND operation by a NAND circuit 210 and an inverter 211) is supplied, along with the signal START output from a refresh control circuit, not shown, to a NAND circuit 210 and two-stage inverters 211 as a signal CLRB to the gate of the pMOSFET 212, while being inverted and output as OSC. As for the other structures, such as timeout control by the oscillator circuit 207 and the counter circuit 208, the present embodiment is similar to the second embodiment already explained with reference to FIG. 25.

Figure 27:
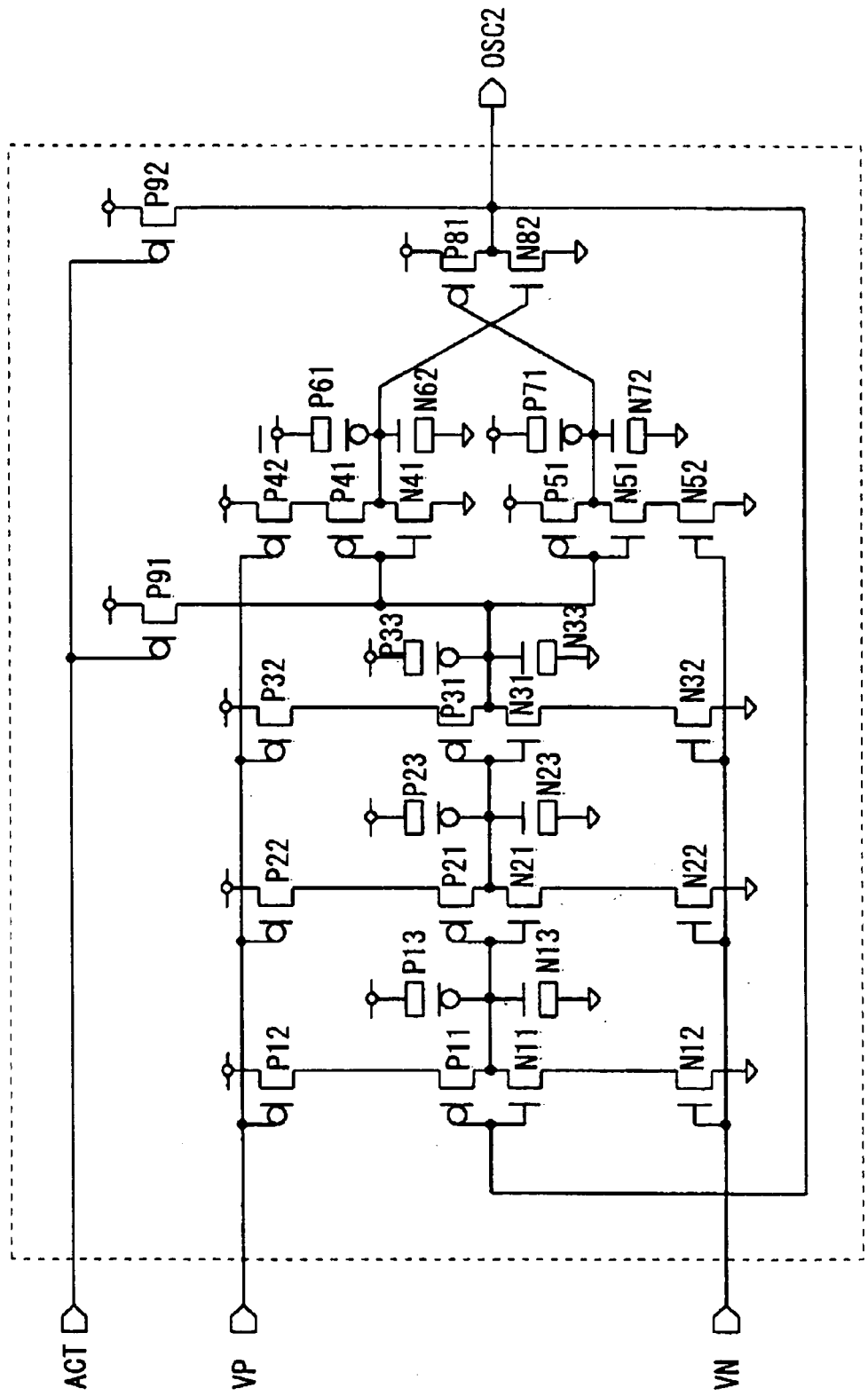
FIG. 27 shows an illustrative configuration of an oscillator circuit of FIGS. 25 and 26.

FIG. 27 shows the configuration of the oscillator circuit 207 shown in FIGS. 25 and 26. This oscillator circuit 207, also termed an 'RC delay oscillator circuit', is composed as a ring oscillator which ceases its oscillation when the signal ACT is at a low level, and which is activated when the signal ACT is at a high level. The oscillator circuit 207 has its oscillation frequency controlled depending on the capacitance value of the MOS capacitor added and on the voltage value of the bias voltage VP and VN. When the signal ACT is high, a ring oscillator, substantially made up by five-stage inverters, is oscillated. When the signal ACT is at a low level, the oscillation of the ring oscillator ceases.

Referring to FIG. 27, each of the three stage inverters is made up by a current source transistors (P12, N12), in which a current source transistor (P12) is provided across a CMOS inverter (P11, N11) and the power supply VCC and a current source transistor (N12) is provided across a CMOS inverter and the ground, and MOS capacitors (P13, N13), connected to an output node of the inverter. The gates of the current source transistors P12 and N12 are supplied with the bias voltage VP and VN, respectively. A current source transistor P42, the gate of which is supplied with the bias voltage VP, is connected across the fourth stage inverter (P41, N41) and the power supply, whilst a current source transistor N52, the gate of which is supplied with the bias voltage VN, is connected across the fourth stage inverter (P51, N51) and the ground VSS. An output end of the third stage inverter (P31, N31) is connected common to an input end of the fourth stage inverter (P41, N41) and an input end of the fourth stage inverter (P54, N53), two output ends of the fourth stage inverter are connected to an input end of a fifth stage CMOS inverter (driver circuit) (P81, N81), and an output end of the fifth stage CMOS inverter (P81, N81) is connected to an input end of the first stage inverter (P11, N11). A pMOSFET 91, the gate of which is supplied with the signal ACT, is connected across the output end of the third stage inverter (P31, N31) and the power supply VCC, whilst a pMOSFET 92, the gate of which is supplied with the signal ACT, is connected across the output end of the fifth stage inverter P81, N81 and the power supply VCC. When the signal ACT is low, the pMOSFETs 91 and 92 are turned on to raise the input of the fourth stage inverters (P41-N41 and P51-N51) to a high level to fix the output OSC2 to a high level to stop the oscillations. In this ring oscillator, the period of oscillations of the output signal OSC2 may be variably set by changing the values of the bias voltages VP, VN. Of course, the output signal OSC2 may be set to the low level when the oscillations come to a close.

Figure 28:
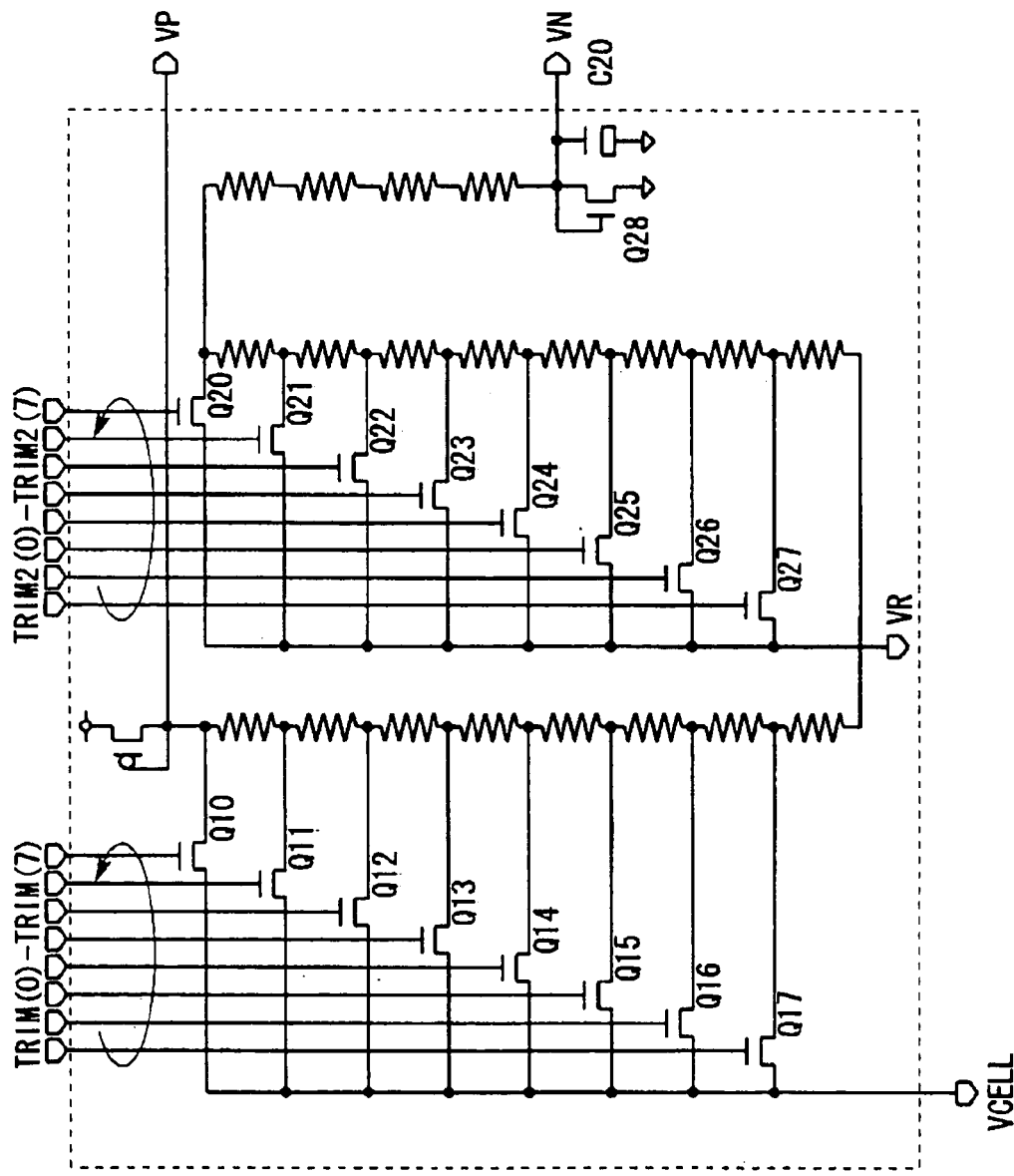
FIG. 28 shows an illustrative configuration of a circuit for generating the bias potential of the oscillator circuit of FIG. 27.

FIG. 28 shows the configuration of a bias voltage generating circuit used for generating the bias voltages VP and VN of FIG. 27. In FIG. 28, switches Q10 to Q17 and Q20 to Q27 are provided for shorting the resistors of the series resistance circuit and are controlled by trimming signals TRM1 (0 to 7) and TRM2 (0 to 7). Although there is no particular limitation to the trimming signals TRM1 (0 to 7) and TRM2 (0 to 7), these signals are formed by cutting the fuses using e.g. a laser light beam.

Figure 29:
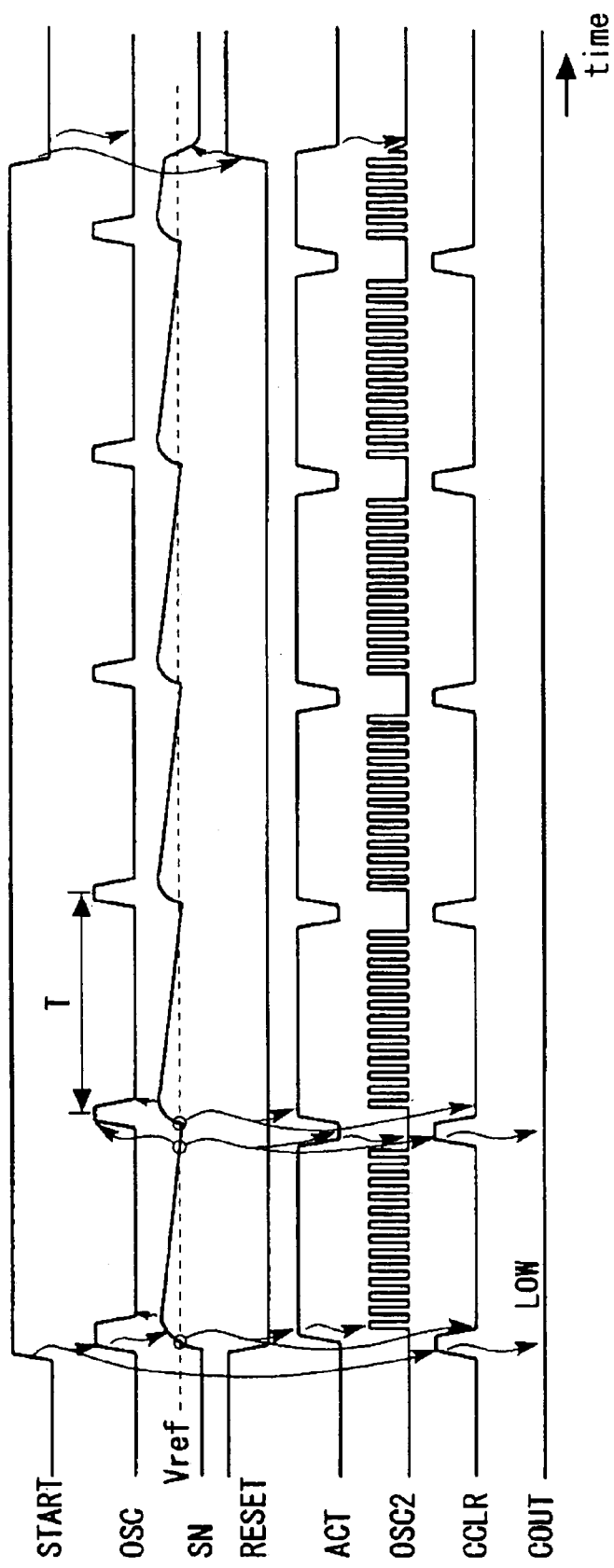
FIG. 29 shows an example of an operational waveform of the cell leakage monitor circuit shown in FIG. 25.

FIG. 29 depicts a signal waveform diagram for illustrating the operation of the configuration of FIG. 25. The refresh pulse OSC is periodically output at a period T, which period is shorter than the fixed period prescribed by the oscillator circuit 207 and the counter 208.

Figure 30:
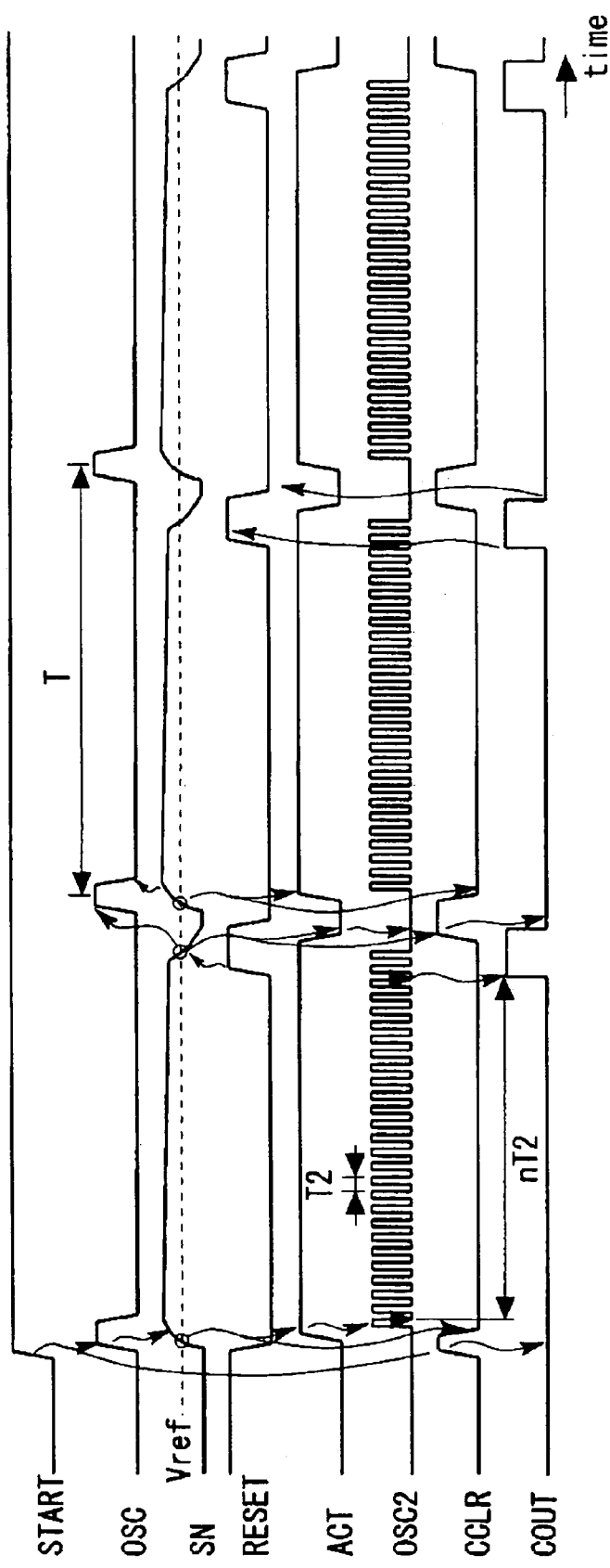
FIG. 30 shows a second example of an operational waveform of the cell leakage monitor circuit shown in FIG. 25.

FIG. 30 depicts a signal waveform diagram illustrating the operation of the circuit configuration shown in FIG. 25. With the voltage of the node SN not less than VREF, the output AOUT of the voltage comparator 203 is high, so that the signal ACT is high and the counter 208 counts the oscillation output pulse OSC2 of the oscillator circuit 207. When the counter 208 has counted OSC2 n times, such that its 15 bits are high (that is, when time nT2 has been counted), the output COUT of the counter 208 is high and the reset signal RESET goes high to turn on the nMOSFET. The node SN is discharged to the ground potential. When the voltage of the node SN is VREF or lower, and the output AOUT of the voltage comparator 203 is low, the signal ACT goes low to stop the oscillations of the oscillator circuit 207. The signal CCLR goes high to reset the counter 208. The signal OSC goes high after the delay time of the delay circuit 206 to turn on the pMOSFET 212 to charge the node SN. The output AOUT of the voltage comparator 203 goes high and the signal OSC goes low. The above-described sequence of operations is repeated to output the refresh pulses OSC at the period T.

Figure 31:
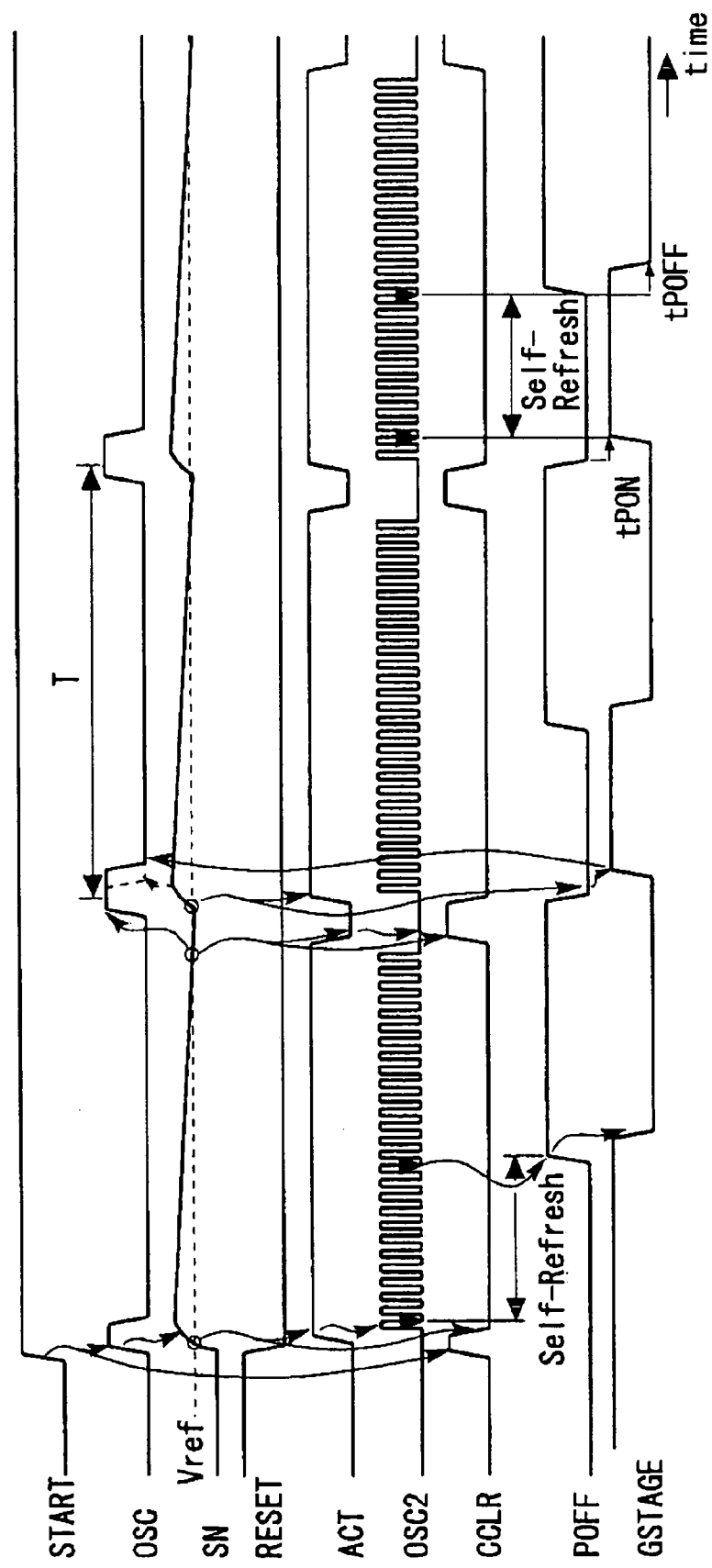
FIG. 31 shows an example of an operational waveform of the cell leakage monitor circuit shown in FIG. 26.

FIG. 31 shows an exemplary operation of FIG. 26. When the counter 208 counts the oscillation output pulses of the oscillator circuit 207 to raise the signal POFF to high, the internal power supply circuit 209 controls the voltages VPP, VDL, VPLT, VBLR and VBB to set the signal GSTATE to a low level.

With the voltage at the node SN not lower than VREF, the output AOUT of the voltage comparator 203 is high and hence the signal ACT goes high so that the counter 208 counts the oscillation output pulse OSC2 of the oscillator circuit 207. When the counter 208 has counted the pulses OSC2 a preset number of times, such that its 13 bits are at a high level, the output POFF of the counter 208 goes high. The internal power supply circuit 209 controls the power supply voltage (see FIG. 18) to set the signal GSTATE to a low level.

The signals POFF and GSTATE are now briefly described. These are control signals generated in the internal power supply off mode. Specifically, the signal POFF is output from the refresh control circuit of the DRAM as an internal power supply stop command to the internal power supply circuit, and represents an internal power supply interruption command and an internal power supply start command, with its high and low levels, respectively. The signal GSTATE is a control signal monitoring the status of the internal power supply circuits to feed back the circuit status to various control circuits, and represents the normal started state and the non-started state of the totality of the internal power supply circuits, when the signal is at a high level and at a low level, respectively. The power supply off mode is a sort of the standby state for causing cessation of the operation of the internal power supply by the signals POFF and GSTATE. As for the power supply off mode, reference is had e.g. to the aforementioned Patent Publication 4. The control operation for the power supply off mode may be summarized as follows:

(a) An entry is made to the self-refresh mode.
(b) All bits are refreshed (self-refresh of FIG. 31). In the self leakage monitor circuit, the leakage source node SN is charged, such that the signal ACT goes high and the oscillator circuit 207 outputs an oscillation signal OSC2.
(c) An entry is made to the power supply off mode.
(d) The cell leakage monitor notifies the refresh by OSC when the potential of the node SN becomes lower than VREF by leakage.
(e) The signal POFF is set to a high level and e.g. the internal power supply is halted. The signal GSTATE then transfers to a high level (when it is checked that the internal power supply has been restored).
(f) The above operations (b) to (e) are repeated.
(g) By issuing a command for restoration to the self refresh, a return may be made from the above cycles to the normal state.

It is noted that the output OSC2 of the oscillator circuit 207 may also be used as a period of the distributed refresh.

Although the preferred embodiments of the present invention have been explained in the foregoing, it is to be noted that the present invention is not limited to the configuration of the illustrated embodiments and may comprise various changes or corrections that may be carried out by those skilled in the art.

The meritorious effects of the present invention are summarized as follows.

According to the present invention, described above, the temperature dependency and the leakage current may be adjusted by the gate voltage in the order of magnitudes of digits, in the junction leakage gate end mode, so that it is possible to realize an optimum cell leakage monitor associated with the real device.

According to the present invention, the power supply off mode may be coped with and the oscillation operation (refresh operation) is continued after confirming the power-up of the internal power supply, thus improving safety and reliability.

According to the present invention, there is provided a timer counter and, in case a refresh pulse is not output after lapse of the fixed period, the leakage source node is reset to output refresh pulses. Hence, it is possible to avoid refresh interruptions in the memory cell array to assure a high operational reliability.

Moreover, according to the present invention, in which there is provided the timer counter, it is possible to enter into the power supply off mode after counting the preset time by the timer counter, thereby reducing the data holding current.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A cell leakage monitor circuit comprising
a circuit for monitoring the quantity of charge stored in a pseudo-cell equivalent to a dynamic memory cell and for outputting a refresh signal when it is detected that said quantity of charge stored in said pseudo-cell has decreased to a preset level by the leakage current of a leakage source; said leakage source being made up by a junction leakage gate end mode of a MOSFET; and
a circuit for variably setting the gate voltage of said MOSFET.

2. The cell leakage monitor circuit as defined in claim 1, wherein
as the leakage current the GIDL (gate induced drain leakage current) of a p-channel MOSFET is employed; and wherein
said cell leakage monitor circuit further comprises
a circuit for selectively setting a boosted voltage or a usual voltage as a voltage supplied to the gate electrode of said p-channel MOSFET.

3. The cell leakage monitor circuit as defined in claim 1, further comprising
a circuit for variably setting the capacitance value of a capacitor added to a charge storage node of said pseudo-cell.

4. A cell leakage monitor circuit comprising:
a leakage source connected to a node of a capacitor of a pseudo-cell equivalent to a dynamic memory cell;
a voltage comparator for comparing the voltage of said node to a predetermined reference voltage for outputting a signal representing the result of comparison;
a delay circuit for receiving the signal representing the result of comparison from said voltage comparator and for delaying said signal representing the result of comparison to output the delayed signal;
a switching circuit for performing switching control so that, if the voltage in said node is not larger than said reference voltage, said capacitor is charged to a preset voltage, based on an output signal of said delay circuit, and so that, if the node voltage exceeds said reference voltage, said node of said leakage source is set to a floating state and;
a circuit for outputting a refresh signal, prescribing the refresh period of a dynamic random access memory, based on said signal representing the result of comparison from said voltage comparator;
wherein said leakage source of said pseudo-cell is formed by a junction leakage gate end mode of a p-channel MOSFET;
said cell leakage monitor circuit further comprising a circuit for variably setting the gate voltage of said p-channel MOSFET of said leakage source.

5. The cell leakage monitor circuit as defined in claim 4, wherein
said leakage source includes a plurality of pMOSFETs connected parallel to said capacitor node; and wherein
said cell leakage monitor circuit further comprises
a leakage source voltage generating circuit for variably setting the gate voltage applied to respective gate electrodes of a plurality of said pMOSFETs.

6. The cell leakage monitor circuit as defined in claim 5, wherein
said leakage source voltage generating circuit includes a plurality of gate voltage circuits associated with said plural p-channel MOSFETs for generating the gate voltage of said p-channel MOSFETs; and wherein
said cell leakage monitor circuit further comprises a selection circuit for generating a control signal for determining which of said gate voltage circuits of said leakage source voltage generating circuit is to be used for supplying the gate voltage to said leakage source.

7. The cell leakage monitor circuit as defined in claim 4, further comprising:
a plurality of systems of said leakage sources, each made up by a plurality of p-channel MOSFETs connected parallel to said node; and a plurality of systems of leakage source voltage generating circuits for variably setting the gate voltage applied to said gate electrodes of said p-channel MOSFETs of said leakage sources.

8. The cell leakage monitor circuit as defined in claim 7, further comprising
a selection circuit for generating a control signal determining the gate voltage generated in said leakage source voltage generating circuit for each of said plural systems of said leakage source voltage generating circuits.

9. The cell leakage monitor circuit as defined in claim 4, further comprising
a selection circuit for outputting a control signal for selecting the capacitance value of a capacitor attached to said node.

10. The cell leakage monitor circuit as defined in claim 6, wherein
said selection circuit includes:
a counter for counting a pulse signal supplied thereto, an output value of said counter being set based on the result of logic operation on the count result and an output control signal supplied thereto; and
a decoder for decoding an output of said counter and for selecting a gate voltage circuit supplying the gate voltage to the p-channel MOSFETs of said leakage sources.

11. The cell leakage monitor circuit as defined in claim 8, wherein
said selection circuit includes:
a counter for counting a pulse signal supplied thereto, an output value of said counter being set based on the result of logic operation of the count result and an output control signal supplied thereto; and
a decoder for decoding an output of said counter and for generating a signal determining the voltage generated in said leakage source voltage generating circuits.

12. The cell leakage monitor circuit as defined in claim 9, wherein
said selection circuit includes:
a counter for counting a pulse signal supplied thereto, an output value of said counter being set based on the result of logical calculations on the count result and an output control signal supplied thereto; and
a decoder for decoding an output of said counter and for generating a control signal selecting the on/off of a switching device connected across the capacitor and the node of said leakage source.

13. The cell leakage monitor circuit as defined in claim 10, wherein
said output control signal supplied to said counter, has a value set depending on whether or not an associated fuse in a fuse circuit is cut.

14. The cell leakage monitor circuit as defined in claim 13, wherein
said fuse circuit includes a circuit for sending out an output signal, prescribed depending on whether or not the fuse has been cut, based on a power-supply-on indicating output signal from a circuit monitoring the power supply voltage.

15. The cell leakage monitor circuit as defined in claim 4, further comprising:
a circuit for controlling periodic outputting and cessation of said refresh signal based on said signal representing the result of comparison by said voltage comparator and a start signal output from a refresh control circuit.

16. The cell leakage monitor circuit as defined in claim 6, further comprising:
a circuit for performing control so that said gate voltage is selected in a power-up sequence on power up.

17. The cell leakage monitor circuit as defined in claim 9, further comprising
a circuit for performing control so that said capacitance value added to said node is selected in a power-up sequence on power up.

18. The cell leakage monitor circuit as defined in claim 9, wherein
said leakage source voltage generating circuit generates said gate voltage based on a value of a control signal which turns off said switch circuit to set said node of said leakage source to a floating state and outputs the so generated gate voltage.

19. The cell leakage monitor circuit as defined in claim 4, further comprising:
a circuit for performing control so that in a power supply off mode, the power up of an internal power supply is confirmed and subsequently the oscillation of said refresh signal is continued.

20. A cell leakage monitor circuit comprising:
a detection circuit for monitoring the quantity of charge stored in a pseudo-cell equivalent to a dynamic memory cell and for outputting a refresh signal when it is detected that said quantity of charge stored in said pseudo-cell has decreased to a preset reference level by the leakage current of a leakage source;
a timer counter, said timer counter counting the time if the result of detection by said detection circuit indicates that the quantity of charge stored in said pseudo-cell exceeds said preset reference level, said timer outputting a timeout notification signal in case the quantity of charge stored in said pseudo-cell is not decreased to said preset reference level during a preset time as from the start of time counting; and
a circuit for outputting a reset signal for discharging the charge stored in said pseudo-cell responsive to the timeout notification signal from said timer counter.

21. The cell leakage monitor circuit as defined in claim 20, further comprising
a circuit for halting the supply of time count clocks to said timer counter and for resetting said timer counter when it is detected that the charges stored in said pseudo-cell have decreased to said preset reference level.

22. The cell leakage monitor circuit as defined in claim 20, further comprising
a circuit for outputting a power supply off controlling signal to a power supply voltage circuit controlling the power supply at a time point when said timer counter has counted a preset time.

23. The cell leakage monitor circuit as defined in claim 20, wherein
said leakage source is a PN junction device.

24. A method of monitoring cell leakage, said method comprising the steps of:
monitoring the quantity of charge stored at a charge storage node of a pseudo-cell equivalent to a dynamic memory cell and outputting a refresh signal when it is detected that said quantity of charge of said pseudo-cell has decreased to a preset level by the leakage current of a leakage source;
employing as said leakage current, the GIDL (gate induced drain leakage current) of a p-channel MOSFET; and variably setting the gate voltage of said MOSFET and/or capacitance value attached to a charge storage node of said pseudo-cell.

25. A method of monitoring cell leakage, said method comprising the steps of:

monitoring the quantity of charge stored in a pseudo-cell equivalent to a dynamic memory cell and outputting a refresh signal when it is detected that said quantity of stored charges of said pseudo-cell has decreased to a preset reference level by the leakage current of a leakage source;

counting time by a timer counter when the quantity of charge stored in said pseudo-cell has exceeded said preset reference level, and outputting a timeout notification in case the quantity of charge stored in said pseudo-cell is not decreased to said preset reference level during a preset time after start of time counting; and outputting a reset signal for discharging the stored charges of said pseudo-cell responsive to said timeout notification from said timer counter.

26. The method as defined in claim 25, further comprising a step of halting the supply of time counting clocks to said timer counter and resetting said timer counter when it is detected that said quantity of stored charges of said pseudo-cell has decreased to said preset reference level.

27. The method as defined in claim 25, further comprising the steps of:

outputting a signal controlling the power supply off to a power supply voltage circuit, controlling the internal power supply voltage for a memory cell array, at a time point said timer counter has counted a preset time period; and said power supply voltage circuit controlling the voltage of said internal power supply voltage to control the outputting of said refresh signal based on a signal output after restoration of said internal power supply voltage.

* * * * *